(12) United States Patent
Zhou et al.

(10) Patent No.: US 11,876,088 B2
(45) Date of Patent: Jan. 16, 2024

(54) SHARED WELL STRUCTURE, LAYOUT, AND METHOD

(71) Applicants: TAIWAN SEMICONDUCTOR MANUFACTURING COMPANY, LTD., Hsinchu (TW); TSMC CHINA COMPANY, LIMITED, Shanghai (CN); TSMC NANJING COMPANY, LIMITED, Jiangsu (CN)

(72) Inventors: Yang Zhou, Hsinchu (TW); Liu Han, Hsinchu (TW); Qingchao Meng, Hsinchu (TW); XinYong Wang, Hsinchu (TW); ZeJian Cai, Hsinchu (TW)

(73) Assignees: TAIWAN SEMICONDUCTOR MANUFACTURING COMPANY, LTD., Hsinchu (TW); TSMC NANJING COMPANY, LIMITED, Nanjiang (CN); TSMC CHINA COMPANY, LIMITED, Shanghai (CN)

( * ) Notice: Subject to any disclaimer, the term of this patent is extended or adjusted under 35 U.S.C. 154(b) by 38 days.

(21) Appl. No.: 17/527,883

(22) Filed: Nov. 16, 2021

(65) Prior Publication Data
US 2022/0399326 A1 Dec. 15, 2022

(30) Foreign Application Priority Data
Jun. 9, 2021 (CN) .......................... 202110641540.8

(51) Int. Cl.
*H01L 27/02* (2006.01)
*H01L 27/092* (2006.01)
(Continued)

(52) U.S. Cl.
CPC ........ *H01L 27/0207* (2013.01); *G06F 30/392* (2020.01); *H01L 21/26513* (2013.01); *H01L 21/74* (2013.01); *H01L 21/76898* (2013.01); *H01L 21/823892* (2013.01); *H01L 23/481* (2013.01); *H01L 25/0657* (2013.01); *H01L 25/50* (2013.01); *H01L 27/0928* (2013.01); *H01L 2225/06513* (2013.01); *H01L 2225/06541* (2013.01)

(58) Field of Classification Search
CPC ...................... H01L 27/0207; H01L 21/26513
See application file for complete search history.

(56) References Cited

U.S. PATENT DOCUMENTS 7,260,442 B2 8/2007 Hwang et al.
9,256,709 B2 2/2016 Yu et al.
(Continued)

FOREIGN PATENT DOCUMENTS

CN 111223864 6/2020

*Primary Examiner* — Thao P Le
(74) *Attorney, Agent, or Firm* — Hauptman Ham, LLP

(57) ABSTRACT

An integrated circuit (IC) structure includes a continuous well including first through third well portions. The continuous well is one of an n-well or a p-well, the first well portion extends in a first direction, the second well portion extends from the first well portion in a second direction perpendicular to the first direction, and the third well portion extends from the first well portion in the second direction parallel to the second well portion.

20 Claims, 12 Drawing Sheets

(51) Int. Cl.
  *H01L 25/065* (2023.01)
  *H01L 23/48* (2006.01)
  *H01L 21/265* (2006.01)
  *H01L 21/768* (2006.01)
  *H01L 21/8238* (2006.01)
  *H01L 25/00* (2006.01)
  *G06F 30/392* (2020.01)
  *H01L 21/74* (2006.01)

(56) References Cited

U.S. PATENT DOCUMENTS

| | | | |
|---|---|---|---|
| 2014/0040838 A1 | 2/2014 | Liu et al. | |
| 2015/0278429 A1 | 10/2015 | Chang | |
| 2019/0326300 A1* | 10/2019 | Liaw | H01L 29/7851 |
| 2020/0396408 A1 | 12/2020 | Kimizuka | |
| 2021/0005600 A1* | 1/2021 | Russ | H01L 29/7408 |
| 2021/0098470 A1* | 4/2021 | Fung | G06F 30/392 |
| 2021/0125878 A1* | 4/2021 | Yao | H01L 27/0623 |
| 2021/0175226 A1* | 6/2021 | Song | H01L 27/0277 |
| 2022/0231008 A1* | 7/2022 | Wang | H01L 27/0262 |
| 2022/0310583 A1* | 9/2022 | Chang | H01L 27/0207 |
| 2023/0170385 A1* | 6/2023 | Tylaite | H01L 29/7436 257/162 |

* cited by examiner

510 — Obtain an IC layout diagram of a stored cell from a cell library, the stored cell including first and second well regions 520 — Extend the first well region from a first cell boundary to a second cell boundary, the first and second cell boundaries being opposite boundaries of the cell in a first direction 530 — Extend the first well region from a third cell boundary to a fourth cell boundary, the third and fourth cell boundaries being opposite boundaries of the cell in a second direction perpendicular to the first direction 540 — Overlap each of the first and second well regions with a pickup region 550 — Store the IC layout diagram of the cell in a storage device 560 — Place the IC layout diagram of the cell in an IC layout diagram of an IC die 570 — Fabricate a semiconductor mask or component based on the IC layout diagram 580 — Perform one or more manufacturing operations based on the IC layout diagram

FIG. 5

SHARED WELL STRUCTURE, LAYOUT, AND METHOD

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications. Various electronic design automation (EDA) tools are used to generate, revise, and verify designs for semiconductor devices while ensuring that IC structure design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flowchart of a method of manufacturing an IC structure, in accordance with some embodiments.

FIG. 5 is a flowchart of a method of generating an IC layout diagram, in accordance with some embodiments.

DETAILED DESCRIPTION

Figure 1A:
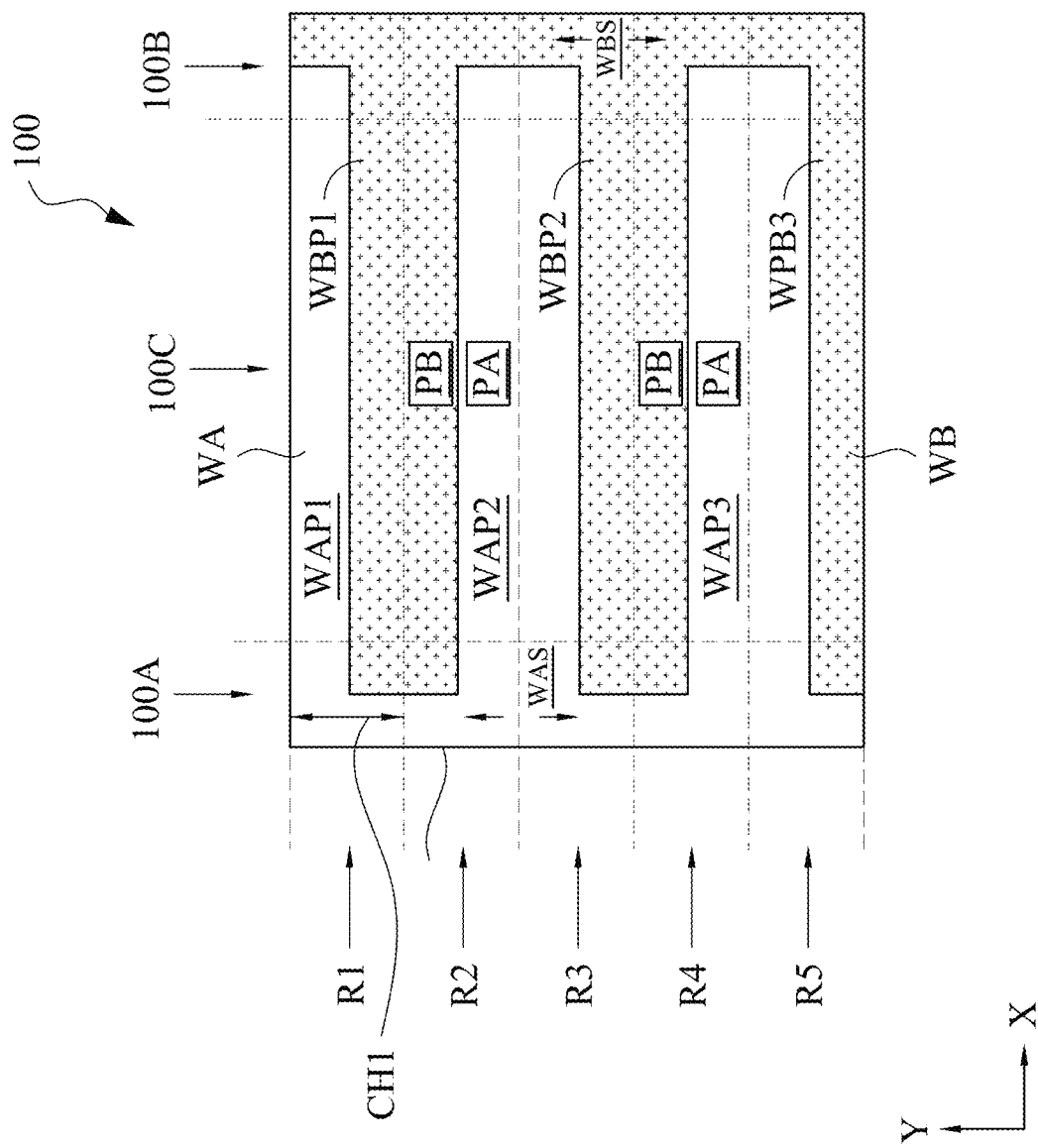
FIG. 1A is a diagram of an IC structure, in accordance with some embodiments.

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC structure based on an IC layout diagram includes a well shared between more than two rows of IC devices by including a first portion extending in a direction perpendicular to the rows and multiple portions extending from the first portion into the rows. The first portion corresponds to a border of, or location within, an IC block including the IC devices, e.g., a block between through-silicon vias (TSVs). The IC block including the shared well enables latch-up protection by including a single pickup structure, e.g., part of a tap cell, capable of biasing each of the multiple portions such that the shared well is biased using a number of pickup structures less than a number of the multiple portions. Compared to approaches in which a row or pair of rows of IC devices corresponds to a single well including at least one pickup structure, the IC block including the shared well uses fewer pickup structures and is thereby capable of increased utilization of space for the IC devices.

FIG. 1A is a diagram of an IC structure 100, in accordance with some embodiments. IC structure 100, also referred to as an IC block 100 in some embodiments, corresponds to a circuit portion, e.g., a digital circuit block, of the substrate of an IC die, e.g., an IC structure 100D discussed below with respect to FIG. 1B, and in some embodiments, is further included in an IC package, e.g., an IC package 100P discussed below with respect to FIG. 1C. In addition to IC structure 100, FIG. 1A depicts X and Y directions.

IC structure 100 is a non-limiting example of an IC structure manufactured based on an IC layout diagram, e.g., an IC layout diagram 600A-600C discussed below with respect to FIGS. 6A-6C, by executing some or all of a method 300 discussed below with respect to FIG. 3.

FIG. 1A depicts a plan view (X-Y plane) of IC structure 100 including border areas 100A and 100B extending in the Y direction and IC devices 100C located between border areas 100A and 100B. In the embodiment depicted in FIG. 1A, five rows R1-R5 of IC devices 100C extend in the X direction, also referred to as a row direction in some embodiments.

IC structure 100 includes a continuous well WA, also referred to as a shared well WA in some embodiments, including a portion WAS located in border area 100A and extending in the Y direction, and portions WAP1-WAP3 extending from portion WAS in the positive X direction within corresponding one or more of rows R1-R5. A continuous well WB, also referred to as a shared well WB in some embodiments, includes a portion WBS located in border area 100B and extending in the Y direction, and portions WBP1-WBP3 extending from portion WBS in the negative X direction within corresponding one or more of rows R1-R5. IC structure 100 also includes at least one instance of a pickup structure PA located in continuous well WA and at least one instance of a pickup structure PB located in continuous well WB, as discussed below.

The orientation of IC structure 100 depicted in FIG. 1A is a non-limiting example provided for the purpose of illustration. In some embodiments, border areas 100A and 100B and portions WAS and WBS extend in the X direction and rows R1-R5 and portions WAP1-WAP3 and WBP1-WBP3 extend in the Y direction. In some embodiments, IC structure 100 has an orientation inverted horizontally and/or vertically compared to the orientation depicted in FIG. 1A.

Each of the figures herein, e.g., FIG. 1A, is simplified for the purpose of illustration. The figures depict views of IC structures, dies, packages, and layout diagrams with various features included and excluded to facilitate the discussion below. In various embodiments, a depicted IC structure, die, package, and/or layout diagram includes one or more features corresponding to power distribution structures, metal interconnects, contacts, vias, gate structures or other transistor elements, isolation structures, or the like, in addition to the features depicted in FIGS. 1A-1C, 4, and 6A-6C.

In various embodiments, IC devices 100C include one or a combination of a logic gate or other digital circuit, a component of a signal or application processor, memory, high-bandwidth memory (HBM), system on an IC (SoIC), transmitter and/or receiver, application-specific IC (ASIC), large-scale integration (LSI) or very large-scale integration (VLSI) circuit, voltage or current regulator, or the like.

IC devices 100C include both n-type metal-oxide-semiconductor (NMOS) and p-type metal-oxide-semiconductor (PMOS) transistors (not shown). The NMOS transistors are located in one of continuous well WA or WB, and the PMOS transistors are located in the other of continuous well WA or WB.

In the embodiment depicted in FIG. 1A, IC devices 100C extend from border area 100A to border area 100B along each of rows R1-R5 having a height CH1, also referred to as cell height CH1 in some embodiments. In various embodiments, IC structure 100 includes IC devices 100C otherwise configured, e.g., by including one or more gaps in one or more rows and/or by extending partially between border areas 100A and 100B in one or more rows, such that the NMOS and PMOS transistors are located in continuous wells WA and WB.

In the embodiment depicted in FIG. 1A, IC devices 100C correspond to each of a total number of five rows R1-R5 of IC structure 100. In various embodiments, IC devices 100C correspond to each of fewer or greater than a total number of five rows and/or correspond to a subset of the total number of rows of IC structure 100.

IC structure 100 is thereby configured to include a total area including at least an area occupied by IC devices 100C and border areas 100A and 100B. In some embodiments, the total area of IC structure 100 is equal to a total area occupied by IC devices 100C and border areas 100A and 100B. In some embodiments, the total area of IC structure 100 is greater than the total area occupied by IC devices 100C and border areas 100A and 100B, and IC structure 100 includes one or more areas (not shown), e.g., one or more dummy devices, in addition to IC devices 100C and border areas 100A and 100B.

A well, e.g., continuous well WA or WB, is a continuous portion of a semiconductor wafer, e.g., a silicon (Si) wafer or an epitaxial Si layer, suitable for forming one or more IC devices, e.g., IC devices 100C. In various embodiments, a well is a p-well based on the semiconductor portion including one or more acceptor dopants, e.g., boron (B) or aluminum (Al), or an n-well based on the semiconductor portion including one or more donor dopants, e.g., phosphorous (P) or arsenic (As). Continuous well WA is one of the p-well or the n-well and continuous well WB is the other of the p-well or the n-well.

In some embodiments, IC structure 100 is surrounded by one or more isolation structures (not shown in FIG. 1A), i.e., a structure including one or more dielectric materials, such that each of continuous wells WA and WB is electrically isolated from the substrate external to IC structure 100. Dielectric materials include one or more of silicon dioxide ($SiO_2$), silicon nitride ($Si_3N_4$), and/or a high-k dielectric material, e.g., a dielectric material having a k value higher than 3.8 or 7.0 such as aluminum oxide ($Al_2O_3$), hafnium oxide ($HfO_2$), tantalum pentoxide ($Ta_2O_5$), or titanium oxide ($TiO_2$), or another suitable material. In some embodiments, IC structure 100 is partially surrounded by one or more isolation structures such that one or both of continuous wells WA or WB is continuous with one or more portions of the substrate (not shown) external to IC structure 100.

In the embodiment depicted in FIG. 1A, continuous wells WA and WB include a same total number n of corresponding portions WAP1-WAP3 (WAPn) and WBP1-WBP3 (WBPn). In some embodiments, continuous wells WA and WB include differing numbers of corresponding portions, e.g., WAPn and WBPn±1.

In the embodiment depicted in FIG. 1A, each of continuous wells WA and WB includes the total number n=3 of corresponding portions WAPn and WBPn. In various embodiments, one or both of continuous wells WA or WB includes a total number n of fewer or greater than three corresponding portions WAPn or WBPn.

In some embodiments, one or both of continuous wells WA or WB includes the total number n of corresponding portions ranging from five (5) to 75. In some embodiments, one or both of continuous wells WA or WB includes the total number n of corresponding portions ranging from 15 to 50. In some embodiments, one or both of continuous wells WA or WB includes the total number n of corresponding portions ranging from 25 to 40.

In some embodiments, continuous well portions WAPn and/or WBPn having the total number n enables IC structure 100 to have a dimension, e.g., in the Y direction, corresponding to a size of IC devices 100C. In some embodiments, continuous well portions WAPn and/or WBPn having the total number n enables IC structure 100 to have the dimension corresponding to a dimension of one or more substrate features (not shown in FIG. 1A) external to IC structure 100, e.g., a height of a TSV structure TSVS discussed below with respect to FIGS. 1B and 1C.

In the embodiment depicted in FIG. 1A, continuous wells WA and WB include respective portions WAPn and WBPn continuous with each other based on the corresponding single portion WAS or WBS extending in the Y direction and being located in the corresponding border area 100A or 100B. In various embodiments, one or both of continuous well WA or WB includes respective portions WAPn or WBPn continuous with each other based on multiple instances of the corresponding portion WAS or WBS extending in the Y direction and/or one or more instances of the corresponding portion WAS or WBS being located in IC structure 100 external to the corresponding border area 100A or 100B.

By the configuration discussed above, IC structure 100 includes continuous wells WA and WB configured, e.g., in an interdigitated, serpentine, or other configuration, such that each of continuous wells WA and WB is shared among more than two rows, e.g., rows R1-R5.

Each instance of pickup structures PA and PB, also referred to collectively as a tap structure in some embodiments, includes a heavily doped volume within a corresponding portion WAPx (one of portions WAPn) of continuous well WA or portion WBPx (one of portions WBPn) of continuous well WB, and having n-type or p-type doping matching the n-well or p-well type of the corresponding continuous well WA or WB.

Each instance of pickup structure PA or PB also includes or contacts one or more conductive elements (not shown) configured to electrically connect the pickup structure to a corresponding power distribution structure (not shown). IC structure 100 is configured such that the n-type continuous well WA or WB and corresponding instance of pickup structure PA or PB are electrically connected to a power distribution structure configured to have a power supply voltage, and the p-type continuous well WA or WB and corresponding instance of pickup structure PA or PB are electrically connected to a power distribution structure configured to have a reference voltage, e.g., ground.

Each of pickup structures PA and PB is thereby configured to, in operation, avoid latch-up events by preventing forward biasing of diodes that include the corresponding continuous well WA or WB and source/drain terminals of transistors located in the corresponding continuous well WA or WB, e.g., by using the power supply voltage to bias one of continuous wells WA or WB being an n-well, thereby avoiding latch-up events by preventing forward biasing of a diode that includes the one of continuous wells WA or WB and a p-type source/drain terminal of a PMOS transistor of IC devices 100C located in the one of continuous wells WA or WB.

In the embodiment depicted in FIG. 1A, instances of pickup structures PA are located in portions WAP2 and WAP3, instances of pickup structures PB are located in portions WBP1 and WBP2, a first instance of each of pickup structures PA and PB is located in row R2, a second instance of each of pickup structures PA and PB is located in row R4, and the instances of pickup structures PA and PB are aligned in the Y direction and located within IC devices 100C.

In various embodiments, instances of pickup structures PA and/or PB are otherwise arranged. In some embodiments, instances of pickup structures PA and/or PB are not aligned in the Y direction. In some embodiments, one or more instances of pickup structures PA and/or PB are located in border area 100A and/or border area 100B and are thereby adjacent to a corresponding one or both of portions WAS or WBS.

In the embodiment depicted in FIG. 1A, IC structure 100 includes totals of two instances each of pickup structures PA and PB, three each of portions WAPn and WBPn, and five rows R1-R5, thereby corresponding to ratios of three portions WAPn to two pickup structures PA, three portions WBPn to two pickup structures PB, and five rows R1-R5 to two instances of each of pickup structures PA and PB.

In some embodiments, IC structure 100 includes numbers of one or more of instances of pickup structures PA and/or PB, portions WAPn and/or WBPn, and/or rows R1-R5 other than those depicted in FIG. 1A whereby one or more of the corresponding ratios have values other than those corresponding to the embodiment depicted in FIG. 1A.

In some embodiments, one or both of the ratio of portions WAPn to instances of pickup structures PA or the ratio of portions WBPn to instances of pickup structures PB has a value ranging from two to twenty. In some embodiments, one or both of the ratio of portions WAPn to instances of pickup structures PA or the ratio of portions WBPn to instances of pickup structures PB has a value ranging from five to fifteen. In some embodiments, one or both of the ratio of portions WAPn to instances of pickup structures PA or the ratio of portions WBPn to instances of pickup structures PB has a value equal to ten (10).

In some embodiments, the ratio of rows, e.g., rows R1-R5, of IC devices 100C to instances of pickup structures PA and/or PB has a value ranging from three to forty. In some embodiments, the ratio of rows of IC devices 100C to instances of pickup structures PA and/or PB has a value ranging from ten to thirty. In some embodiments, the ratio of rows of IC devices 100C to instances of pickup structures PA and/or PB has a value equal to twenty (20).

As ratios of portions WAPn and/or WBPn and/or rows of IC devices 100C to instances of pickup structures PA and/or PB increase, a total number of instances of pickup structures PA and PB for a given size of IC structure 100 decreases such that the area occupied by pickup structures PA and PB relative to the total area of IC structure 100 decreases, and the area capable of being occupied by IC devices 100C relative to the total area of IC structure 100 increases.

The area over which a given pickup structure PA or PB is capable of avoiding latch-up events as discussed above is limited by multiple factors, e.g., feature geometry, doping levels, and/or circuit application criteria. Accordingly, the ratios discussed above have upper limits based on relevant design criteria.

By the configuration discussed above, IC structure 100 includes each of continuous wells WA and WB shared between more than two rows of IC devices 100C by including portion WAS or WBS extending in the Y direction and portions WAPn or WBPn extending into the rows of IC devices 100C. IC structure 100 is thereby capable of achieving latch-up protection by including one or more of pickup structures PA or PB capable of biasing portions WAPn or WBPn such that the number of pickup structures PA or PB is less than the number of portions WAPn or WBPn. Compared to approaches in which each well corresponding to one or two rows of IC devices includes at least one pickup structure, IC structure 100 including one or both of continuous wells WA or WB uses fewer pickup structures and is thereby capable of increased utilization of space for the IC devices.

Figure 1B:
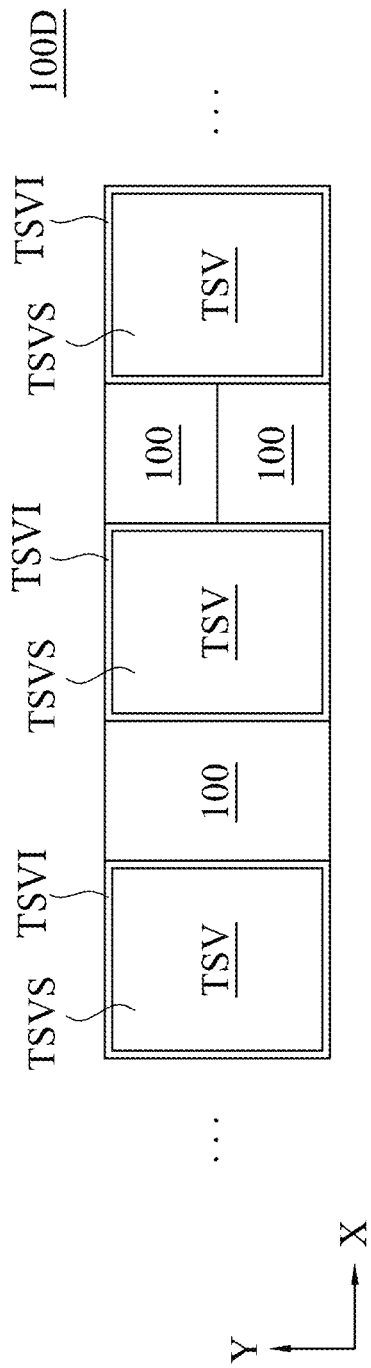
FIG. 1B is a diagram of an IC structure, in accordance with some embodiments.

FIG. 1B is a diagram of an IC structure 100D, in accordance with some embodiments. In addition to a plan view of IC structure 100D, FIG. 1B depicts the X and Y directions discussed above with respect to FIG. 1A. IC structure 100D, also referred to as IC die 100D in some embodiments, is an IC die, IC die portion, or other portion or all of a semiconductor wafer including one or more instances of IC structure 100 discussed above with respect to FIG. 1A, and two or more instances of TSV structure TSVS.

IC structure 100D is a non-limiting example of an IC die or IC die portion manufactured based on one or more IC layout diagrams, e.g., one or more of IC layout diagrams 600A-600C discussed below with respect to FIGS. 6A-6C, by executing some or all of method 300 discussed below with respect to FIG. 3.

A TSV structure, e.g., TSV structure TSVS, is an IC die feature including one or more TSVs surrounded by one or more isolation structures, e.g., a TSV isolation structure TSVI, configured to electrically isolate the one or more TSVs from adjacent IC die features.

A TSV is a conductive segment extending from a front side of a semiconductor substrate, e.g., an IC die including IC structure 100D, to a back side of the substrate, and is thereby configured to electrically connect one or more structures located on the front side of the substrate to one or more structures located on the back side of the substrate. A TSV includes one or more conductive materials, e.g., one or more of polysilicon, copper (Cu), aluminum (Al), tungsten (W), cobalt (Co), ruthenium (Ru), or one or more other materials suitable for providing a low resistance electrical connection between front and back sides of a substrate.

In the embodiment depicted in FIG. 1B, IC structure 100D includes three instances of TSV structures TSVS aligned in the X direction. A first instance of IC structure 100 is located between the first and second instances of TSV structures TSVS, and second and third instances of IC structure 100 are located between the second and third instances of TSV structures TSVS. IC structure 100D thereby includes instances of IC structure 100 and TSV structure TSVS aligned in the X direction.

The orientation and numbers of instances of IC structure 100 and TSV structure TSVS depicted in FIG. 1B are non-limiting examples provided for the purpose of illustration. In various embodiments, IC structure 100D includes numbers of instances of IC structure 100 and/or TSV structure TSVS other than those depicted in FIG. 1B and/or having an orientation other than that depicted in FIG. 1B, e.g., in the Y direction.

In the embodiment depicted in FIG. 1B, IC structure 100D includes each instance of TSV structure TSVS including a single TSV located within TSV isolation structure TSVI. In some embodiments, IC structure 100D includes one or more instances of TSV structure TSVS including more than one TSV located within TSV isolation structure TSVI, or is free from including a TSV located within TSV isolation structure TSVI, e.g., is a dummy area in which TSV isolation structure TSVI corresponds to an entirety of TSV structure TSVS. In some embodiments, at one or more locations depicted in FIG. 1B as including an instance of TSV structure TSVS, IC structure 100D includes one or more structures other than an instance of TSV structure TSVS, e.g., one or more instances of IC structure 100, an IC circuit or device block, or other IC die feature.

In various embodiments, IC structure 100D includes instances of IC structure 100 being a same embodiment of IC structure 100 or more than one embodiment of IC structure 100, e.g., embodiments having differing orientations, numbers of pickup structures, and/or IC devices 100C.

The numbers of instances of IC structure 100 located between adjacent instances of TSV structure TSVS depicted in FIG. 1B are non-limiting examples. In various embodiments, IC structure 100D includes one or more numbers of instances of IC structure 100 located between adjacent instances of TSV structure TSVS greater than two.

In some embodiments, by the configuration discussed above, IC structure 100D includes one or more instances of IC structure 100 in which one or both of border areas 100A or 100B and one or both of continuous well portions WAS or WBS, each discussed above with respect to FIG. 1A, is adjacent to an instance of TSV isolation structure TSVI. In some embodiments, a border area 100A or 100B or continuous well portion WAS or WBS adjacent to an instance of TSV isolation structure TSVI is considered to be adjacent to the corresponding instance of TSV structure TSVS and to the TSV within the adjacent instance of TSV isolation structure TSVI.

By the configuration discussed above, IC structure 100D includes one or more instance of IC structure 100, and is thereby capable of realizing the benefits discussed above with respect to IC structure 100.

Figure 1C:
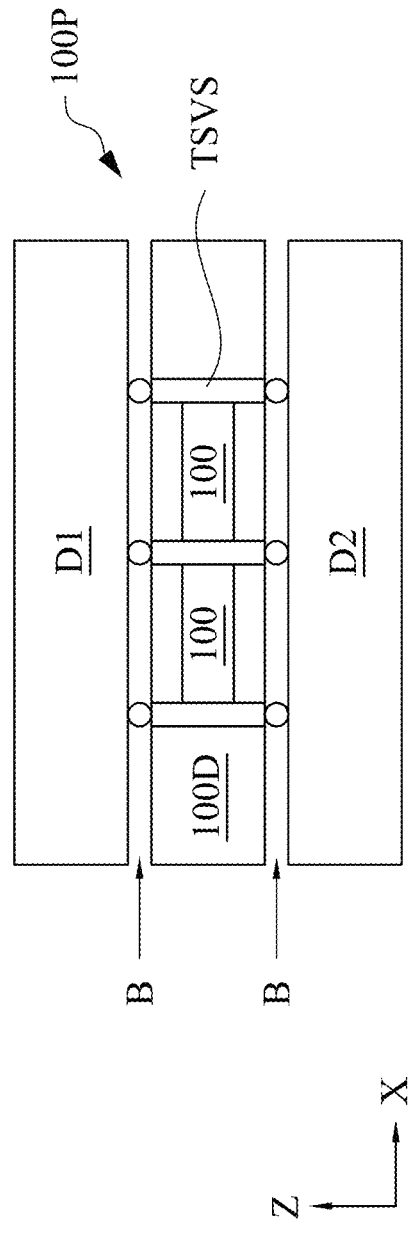
FIG. 1C is a diagram of an IC package, in accordance with some embodiments.

FIG. 1C depicts IC package 100P, in accordance with some embodiments. In addition to IC package 100P, FIG. 1C depicts the X direction discussed above with respect to FIG. 1A and a Z direction perpendicular to each of the X and Y directions. FIG. 1C thereby corresponds to a cross-sectional view of each of the plan views depicted in FIGS. 1A and 1B.

IC package 100P is a non-limiting example of an IC package including one or more instances of IC structure 100D and manufactured by executing some or all of method 300 discussed below with respect to FIG. 3.

In addition to IC structure 100D, IC package 100P includes IC dies D1 and D2 electrically and mechanically connected to IC structure 100D through bump structures B such that IC structure 100D and IC dies D1 and D2 are aligned in the Z direction.

The arrangement and numbers of IC dies D1 and D2 and instances of IC structure 100D depicted in FIG. 1C are non-limiting examples provided for the purpose of illustration. In various embodiments, IC package 100P includes numbers of IC dies and/or instances of IC structure 100D other than those depicted in FIG. 1C and/or having an arrangement other than that depicted in FIG. 1C, e.g., more than one instance of IC structure 100D and/or at least one IC die (not shown) in addition to IC die D1 or D2 electrically and mechanically connected to IC structure 100D on a corresponding top or bottom side of IC structure 100D.

In various embodiments IC package 100P is a 2.5D IC package, a 3DIC package, an integrated fan-out (InFO) package, or other IC package type suitable for including IC structure 100D including instances of TSV structure TSVS.

Each of IC dies D1 and D2 is an IC die, IC die portion, or other portion or all of a semiconductor wafer. In some embodiments, one or both of IC die D1 or D2 is a substrate having a fan-out arrangement, e.g., an interposer.

A bump structure, e.g., a bump structure B is a conductive structure that overlies and contacts portions of IC structure 100D and/or dies D1 and/or D2, thereby being configured to provide electrical connections between IC structure 100D and dies D1 and/or D2. In some embodiments, bump structures include lead. In some embodiments, bump structures include lead-free materials such as tin, nickel, gold, silver, copper, or other materials suitable for providing electrical connections to external conductive elements. In some embodiments, bump structures have substantially spherical shapes. In some embodiments, bump structures are controlled collapse chip connection (C4) bumps, ball grid array bumps, microbumps or the like.

In some embodiments, IC package 100P does not include bump structures B between IC structure 100D and one or both of IC dies D1 or D2, and IC structure 100D is directly bonded to, and thereby electrically connected to, the corresponding one or both of IC dies D1 or D2.

In some embodiments, some or all of the instances of TSV structure TSVS on one or more instances of IC structure 100D and one or more bump structures B, if present, are part of a power distribution structure of IC package 100P.

By the configuration discussed above, IC package 100P includes at least one instance of IC structure 100D in which one or more instances of IC structure 100 is adjacent to one or more instances of TSV structure TSVS such that IC package 100P is capable of realizing the benefits discussed above with respect to IC structure 100.

Figure 2:
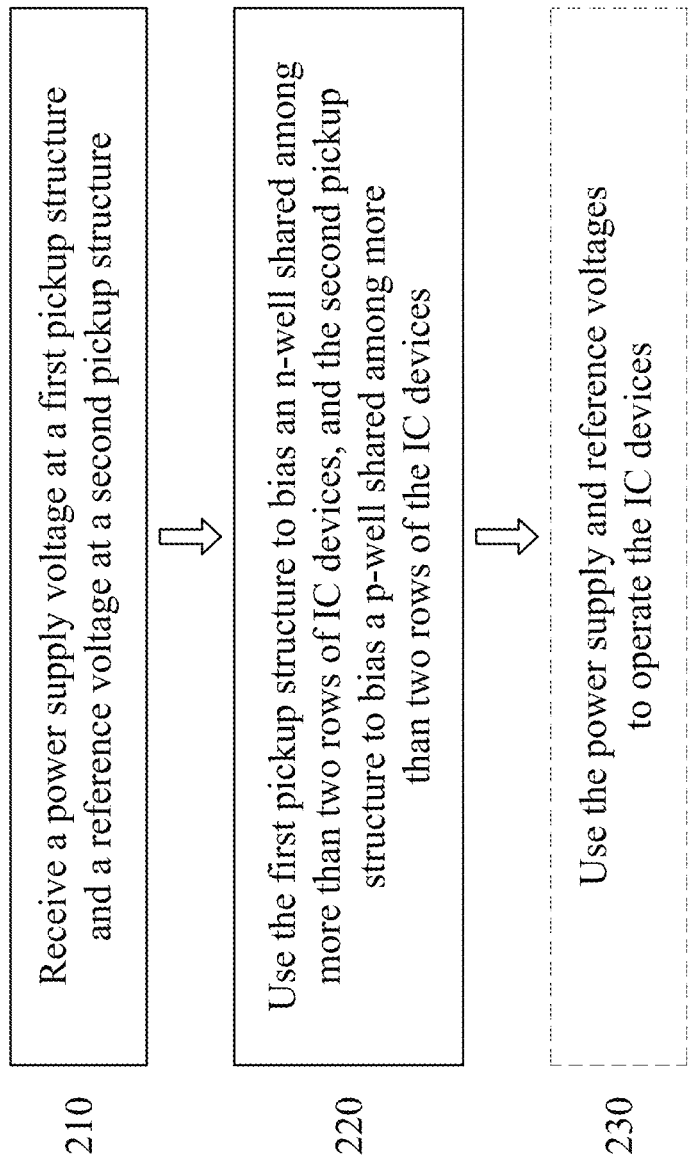
FIG. 2 is a flowchart of a method of operating an IC device, in accordance with some embodiments.

FIG. 2 is a flowchart of a method 200 of operating an IC device, in accordance with some embodiments. Method 200 is usable with an IC structure including shared wells, e.g., IC structure 100 discussed above with respect to FIGS. 1A-1C.

The sequence in which the operations of method 200 are depicted in FIG. 2 is for illustration only; the operations of method 200 are capable of being executed in sequences that differ from that depicted in FIG. 2. In some embodiments, operations in addition to those depicted in FIG. 2 are performed before, between, during, and/or after the operations depicted in FIG. 2.

In some embodiments, some or all of the operations of method 200 are a subset of a method of operating a circuit including shared wells, e.g., IC devices 100C discussed above with respect to FIG. 1A, a method of operating an IC die, e.g., IC structure 100D discussed above with respect to FIG. 1B, and/or a method of operating an IC package, e.g., IC package 100P discussed above with respect to FIG. 1C.

At operation 210, a power supply voltage is received at a first pickup structure and a reference voltage is received at a second pickup structure. Receiving the power supply voltage includes receiving the power supply voltage from a first power distribution structure, and receiving the reference voltage includes receiving the reference voltage from a second power distribution structure separate from the first power distribution structure.

In some embodiments, receiving the power supply voltage at the first pickup structure includes receiving the power supply voltage at an instance of one of pickup structures PA or PB, and receiving the reference voltage at the second pickup structure includes receiving the reference voltage at an instance of the other of pickup structures PA or PB, as discussed above with respect to FIG. 1A.

In some embodiments, the first pickup structure is one first pickup structure of a plurality of first pickup structures, and receiving the power supply voltage at the first pickup structure includes receiving the power supply voltage at each first pickup structure of the plurality of first pickup structures. In some embodiments, the second pickup structure is one second pickup structure of a plurality of second pickup structures, and receiving the reference voltage at the second pickup structure includes receiving the reference voltage at each second pickup structure of the plurality of second pickup structures.

At operation 220, the first pickup structure is used to bias an n-well shared among more than two rows of IC devices, and the second pickup structure is used to bias a p-well shared among more than two rows of the IC devices. Using the first pickup structure to bias the shared n-well includes biasing the shared n-well with the power supply voltage, and using the second pickup structure to bias the shared p-well includes biasing the shared p-well with the reference voltage. Biasing the shared n-well with the power supply voltage includes preventing forward biasing of a diode including the n-well and a S/D terminal of a PMOS transistor of the IC devices, and biasing the shared p-well with the reference voltage includes preventing forward biasing of a diode including the p-well and a S/D terminal of an NMOS transistor of the IC devices.

In some embodiments, using the first pickup structure to bias the shared n-well includes using an instance of one of pickup structures PA or PB to bias a corresponding one of continuous wells WA or WB, and using the second pickup structure to bias the shared p-well includes using an instance of the other of pickup structures PA or PB to bias the corresponding other one of continuous wells WA or WB, as discussed above with respect to FIG. 1A.

In some embodiments, using the instance of the one of pickup structures PA or PB to bias the corresponding one of continuous wells WA or WB includes using multiple instances of the one of pickup structures PA or PB to bias the corresponding one of continuous wells WA or WB, and using the instance of the other of pickup structures PA or PB to bias the corresponding other one of continuous wells WA or WB includes using multiple instances of the other of pickup structures PA or PB to bias the corresponding other one of continuous wells WA or WB, as discussed above with respect to FIG. 1A.

In some embodiments, the shared n-well is one shared n-well of a plurality of shared n-wells, each shared n-well including a corresponding first pickup structure of a plurality of first pickup structures, and biasing the shared n-well includes using each first pickup structure of the plurality of first pickup structures to bias a corresponding shared n-well of the plurality of shared n-wells. In some embodiments, the power supply voltage is one power supply voltage of a plurality of power supply voltages, and using each first pickup structure of the plurality of first pickup structures to bias the corresponding shared n-well of the plurality of shared n-wells includes biasing each of multiple subsets of the plurality of shared n-wells with a corresponding power supply voltage of the plurality of power supply voltages. In some embodiments, the shared p-well is one shared p-well of a plurality of shared p-wells, each shared p-well including a corresponding second pickup structure of a plurality of second pickup structures, and biasing the shared p-well includes using each second pickup structure of the plurality of second pickup structures to bias a corresponding shared p-well of the plurality of shared p-wells.

At operation 230, in some embodiments, the power supply and reference voltages are used to operate the IC devices. Operating the IC devices includes operating PMOS transistors located in the shared n-well corresponding to more than two rows of the IC devices, and operating NMOS transistors located in the shared p-well corresponding to more than two rows of the IC devices.

In some embodiments, operating the IC devices includes operating IC devices 100C discussed above with respect to FIG. 1A. In some embodiments, operating the IC devices includes operating the IC devices located between TSV structures, e.g., TSV structures TSVS discussed above with respect to FIGS. 1B and 1C. In some embodiments, operating the IC devices includes operating an IC die, e.g., IC structure 100D discussed above with respect to FIGS. 1B and 1C. In some embodiments, operating the IC devices includes operating an IC package, e.g., IC package 100P discussed above with respect to FIG. 1C.

By executing some or all of the operations of method 200, power supply and reference voltages are used to bias, respectively, an n-well shared among more than two rows of IC devices and a p-well shared among more than two rows of the IC devices, thereby obtaining the benefits discussed above with respect to IC structure 100.

Figure 3:
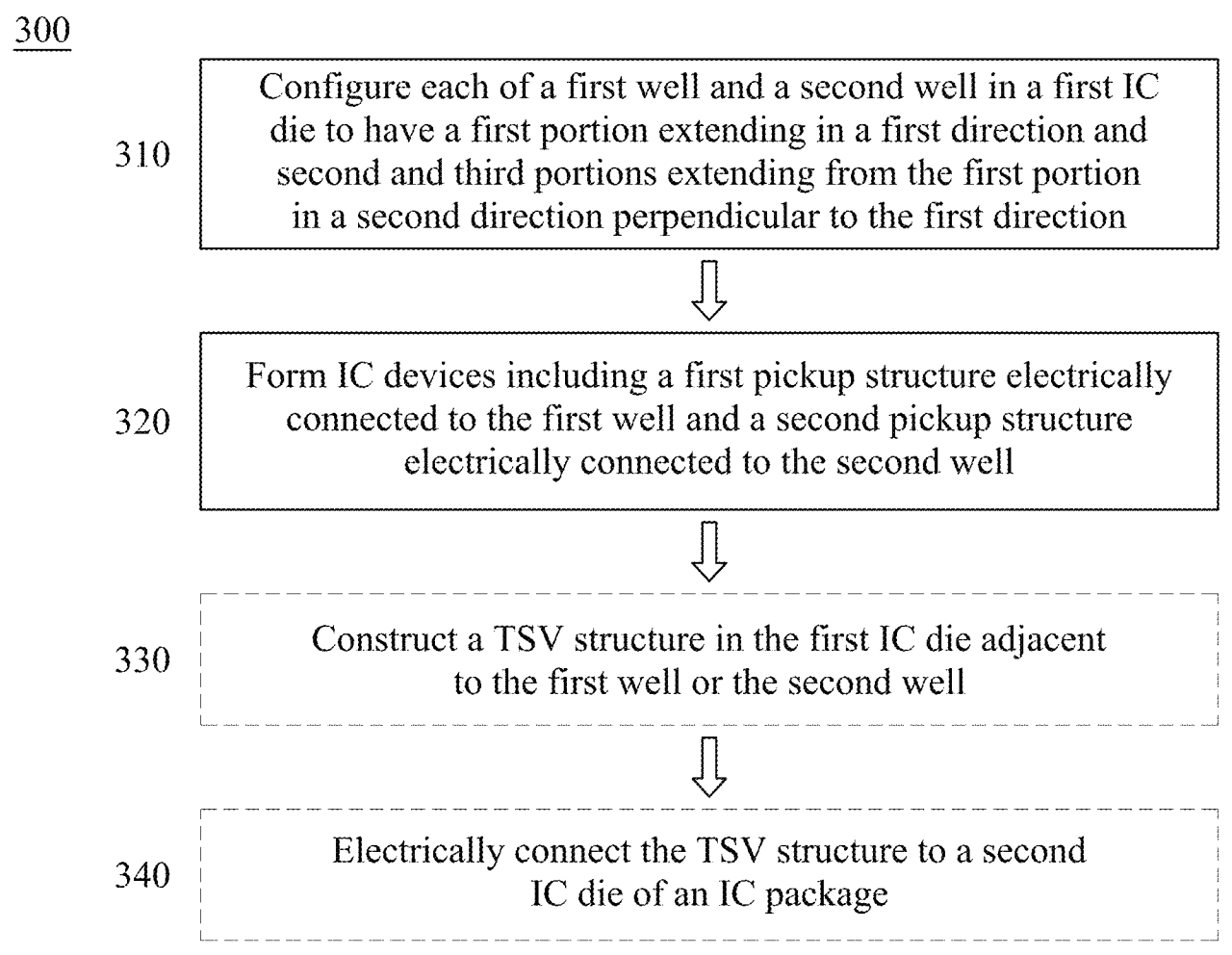

FIG. 3 is a flowchart of a method 300 of manufacturing an IC structure, in accordance with some embodiments. Method 300 is operable to form IC structure 100 discussed above with respect to FIGS. 1A and 1B, IC structure 100D discussed above with respect to FIGS. 1B and 1C, and/or IC package 100P discussed above with respect to FIG. 1C.

In some embodiments, the operations of method 300 are performed in the order depicted in FIG. 3. In some embodiments, the operations of method 300 are performed in an order other than the order depicted in FIG. 3. In some embodiments, one or more additional operations are performed before, during, and/or after the operations of method 300. In some embodiments, performing some or all of the operations of method 300 includes performing one or more operations as discussed below with respect to IC manufacturing system 900 and FIG. 9.

At operation 310, each of a first well and a second well is configured to have a first portion extending in a first direction and second and third portions extending from the first portion in a second direction perpendicular to the first direction. Configuring the first and second wells includes configuring one of the first or second wells as an n-well in a first IC die and the other of the first or second wells as a p-well in the first IC die.

In some embodiments, configuring the first well to have the first portion extending in the first direction and second and third portions extending from the first portion in the second direction includes configuring continuous well WA to have portion WAS extending in the Y direction and two of portions WAPn extending in the X direction, and configuring the second well to have the first portion extending in the first direction and second and third portions extending from the first portion in the second direction includes configuring continuous well WB to have portion WBS extending in the Y direction and two of portions WBPn extending in the X direction, as discussed above with respect to FIG. 1A.

In some embodiments, the first well is one first well of a plurality of first wells, the second well is one second well of a plurality of second wells, and configuring each of the first and second wells includes configuring each first well of the plurality of first wells and each second well of the plurality of second wells to have a first portion extending in a first direction and second and third portions extending from the first portion in a second direction perpendicular to the first direction.

In some embodiments, configuring a well, e.g., the first and/or second well, includes performing one or more implantation processes in an area of a semiconductor substrate corresponding to the well, whereby a predetermined doping concentration is achieved for one or more given dopants as discussed above with respect to FIG. 1A. In some embodiments, configuring a well includes configuring one of the first or second wells by performing the one or more implantation processes, whereby an area of the substrate external to that of the one of the first or second wells is considered to be configured as the other of the first or second wells, e.g., configuring the first well as an n-well by performing a P and/or As implantation, thereby configuring an area outside the first well as a p-well based on being a portion of a p-type substrate.

In some embodiments, configuring each of the first and second wells includes locating one or both of the first or second wells adjacent to a TSV structure, e.g., locating one or both of continuous wells WA and WB of IC structure 100 adjacent to one or more instances of TSV structure TSVS, as discussed above with respect to FIG. 1B.

In some embodiments, configuring each of the first and second wells includes configuring each of the first and second wells based on one or more of cells 400A-400C discussed below with respect to FIG. 4 and/or one or more of IC layout diagrams 600A-600C discussed below with respect to FIGS. 6A-6C.

At operation 320, IC devices are formed including a first pickup structure electrically connected to the first well and a second pickup structure electrically connected to the second well. Forming the IC devices includes forming at least one PMOS transistor in at least one of the second or third portions of the first or second well configured as the n-well, and forming at least one NMOS transistor in at least one of the second or third portions of the first or second well configured as the p-well.

Forming the pickup structures electrically connected to the first and second wells includes performing one or more implantation processes whereby the first pickup structure has a same doping type as that of the first well and a doping concentration higher than that of the first well, and the second pickup structure has a same doping type as that of the second well and a doping concentration higher than that of the second well.

Forming the pickup structures electrically connected to the first and second wells includes forming an electrical connection from the first pickup structure to a first power distribution structure configured to have one of a power supply voltage or a reference voltage, and forming an electrical connection from the second pickup structure to a second power distribution structure configured to have the other of the power supply voltage or the reference voltage.

In some embodiments, forming the IC devices including the first and second pickup structures includes forming IC devices 100C and one or more instances of each of pickup structures PA and PB discussed above with respect to FIG. 1A.

In some embodiments, the IC devices are one instance of IC devices of a plurality of instances of IC devices, the first well is one first well of a plurality of first wells, the second well is one second well of a plurality of second wells, and forming the IC devices including the first and second pickup structures includes forming each instance of IC devices of the plurality of instances of IC devices including first and second pickup structures corresponding to a first well of the plurality of first wells and a second well of the plurality of second wells.

Forming the IC devices including the first and second pickup structures includes building a plurality of IC devices, e.g., transistors, logic gates, memory cells, interconnect structures, and/or other suitable devices, by performing a plurality of manufacturing operations, e.g., one or more of a lithography, diffusion, deposition, etching, planarizing, or other operation suitable for building the plurality of IC devices in the semiconductor wafer.

In some embodiments, forming the IC devices including the first and second pickup structures includes forming the IC devices including the first and second pickup structures based on one or more of cells 400A-400C discussed below with respect to FIG. 4 and/or one or more of IC layout diagrams 600A-600C discussed below with respect to FIGS. 6A-6C.

At operation 330, in some embodiments, a TSV structure is constructed in the first IC die adjacent to the first well or the second well. Constructing the TSV structure includes constructing a TSV spanning front and back sides of the first IC die and surrounded by a TSV isolation structure.

In some embodiments, constructing the TSV structure includes constructing a TSV structure adjacent to each of the first and second wells. In some embodiments, constructing the TSV structure includes constructing at least one instance of TSV structure TSVS discussed above with respect to FIGS. 1B and 1C.

In some embodiments, the first well is one first well of a plurality of first wells, the second well is one second well of a plurality of second wells, the TSV structure is one TSV structure of a plurality of TSV structures, and constructing the TSV structure includes constructing each TSV structure of the plurality of TSV structures adjacent to a corresponding first well of the plurality of first wells and/or a corresponding second well of the plurality of second wells.

Constructing the TSV structure includes performing a plurality of manufacturing operations including depositing and patterning one or more photoresist layers, performing one or more etching processes, and performing one or more deposition processes whereby one or more conductive materials are configured to form a continuous, low resistance structure spanning the front and back sides of the IC die and surrounded by one or more continuous dielectric layers whereby the continuous, low resistance structure is electrically isolated from adjacent features, e.g., the first or second well.

At operation 340, in some embodiments, the TSV structure is electrically connected to a second IC die of an IC package. In various embodiments, electrically connecting the TSV structure to the second IC die includes directly connecting the TSV structure to the second IC die or connecting the TSV structure to the second IC die through a bump structure. In some embodiments, electrically connecting the TSV structure to the second IC die of the IC package includes electrically connecting the TSV structure to the second IC die of a 2.5D IC package, a 3D IC package, or an InFO package.

In some embodiments, electrically connecting the TSV structure to the second IC die of the IC package includes electrically connecting at least one instance of TSV structure TSVS to at least one of IC dies D1 or D2 of IC package 100P discussed above with respect to FIG. 1C.

Electrically connecting the TSV structure to the second IC die includes performing one or more IC package manufacturing operations whereby a portion or all of the IC die including the TSV structure is connected to the second IC die of the IC package. In various embodiments, the one or more IC package manufacturing operations include one or more of a die separation process, a molding injection or deposition, a bonding process, a metal deposition process, a solder process, an annealing process, or another process suitable for manufacturing an IC package.

In some embodiments, operation 340 is repeated such that TSV structures of a plurality of IC dies are electrically connected to the first or second IC die and/or one or more IC dies in addition to the first and second IC dies.

By performing some or all of the operations of method 300, an IC structure is manufactured in which first and second wells are shared among more than two rows of IC devices, thereby obtaining the benefits discussed above with respect to IC structures 100 and 100D and IC package 100P.

Figure 4:
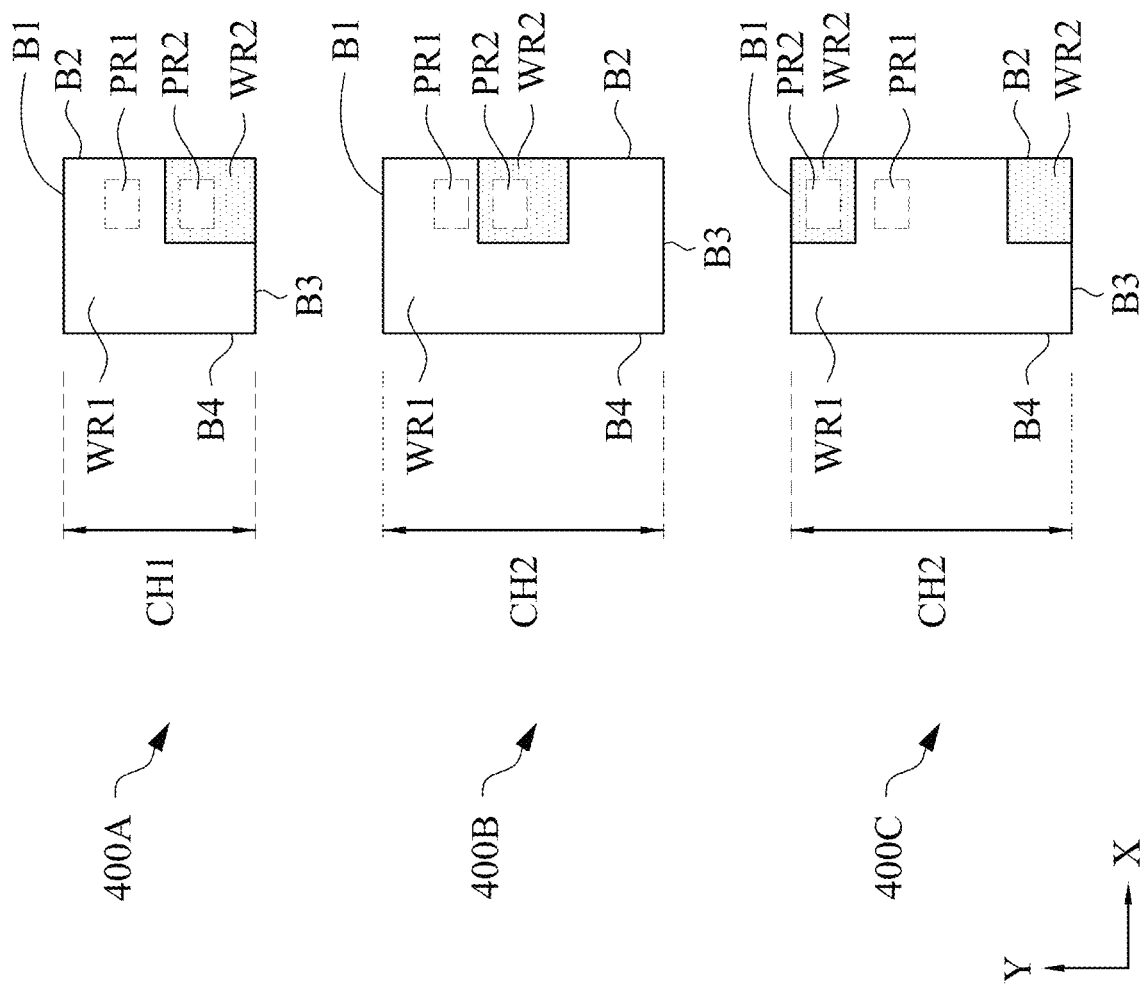
FIG. 4 is a diagram of IC layout diagrams, in accordance with some embodiments.

FIG. 4 is a diagram of IC layout diagrams of cells 400A-400C, in accordance with some embodiments. FIG. 4 depicts a plan view of each cell 400A-400C and the X and Y directions discussed above with respect to FIGS. 1A and 1B.

An IC layout diagram, e.g., an IC layout diagram including one or more of cells 400A-400C, is usable in a manufacturing process, e.g., method 300 discussed above with respect to FIG. 3 and/or the IC manufacturing flow associated with IC manufacturing system 900 discussed below with respect to FIG. 9, as part of defining one or more features of an IC structure, e.g., IC structure 100 discussed above with respect to FIGS. 1A-3.

In various embodiments, a cell, e.g., cell 400A-400C, is a standalone cell, e.g., a standard cell stored in a cell library such as a cell library 807 discussed below with respect to FIG. 8, or is a part of a larger IC layout diagram, e.g., one or more of IC layout diagrams 600A-600C discussed below with respect to FIGS. 6A-6C.

In some embodiments, one or more of cells 400A-400C is generated by performing one or more operations of a method, e.g., a method 500 discussed below with respect to FIG. 5.

Each of cells 400A-400C includes boundaries B1-B4, well regions WR1 and WR2, and in some embodiments, a pickup region PR1 positioned in well region WR1 and a pickup region PR2 positioned in well region WR2. Cell 400A has cell height CH1 and each of cells 400B and 400C has a cell height CH2.

The orientations of each of cells 400A-400C are non-limiting examples provided for the purpose of illustration. Each of cells 400A-400C is capable of being rotated and/or inverted with respect to one or both of the X or Y directions.

A well region, e.g., well region WR1 or WR2, is a region in an IC layout diagram included in the manufacturing process as part of defining a portion or all of one or more n-well or p-well structures, e.g., a continuous well WA or WB discussed above with respect to FIG. 1A, in a portion of a semiconductor substrate, e.g., IC structure 100 or 100D discussed above with respect to FIGS. 1A-3.

A pickup region, e.g., pickup region PR1 or PR2, is a region in an IC layout diagram included in the manufacturing process as part of defining a pickup structure, e.g., pickup structure PA or PB discussed above with respect to FIGS. 1A-3.

In some embodiments, one or more of cells 400A-400C is referred to as a border cell. In some embodiments in which a cell 400A-400C includes pickup regions PR1 and PR2, the cell 400A-400C is referred to as a pickup cell, strap cell, or tap cell.

Each of well regions WR1 and WR2 is usable as part of defining a portion of either one of continuous wells WA or WB, and each of pickup regions PR1 and PR2 is usable as part of defining an instance of pickup structure PA or PB corresponding to the continuous well WA or WB, as discussed above with respect to FIGS. 1A-3, and further discussed below.

Each of cells 400A-400C has a border defined by boundaries B1-B4. Each of boundaries B1 and B3 extends in the X direction, and each of boundaries B2 and B4 extends in the Y direction. Each of cells 400A-400C includes well region WR1 extending in the Y direction from boundary B1 to boundary B3, and in the X direction from boundary B4 to boundary B2.

Cell 400A includes well region WR1 extending from boundary B1 to boundary B3 along an entirety of boundary B4 and along a portion of boundary B2 between boundary B1 and well region WR2. Well region WR1 extends from boundary B4 to boundary B2 along an entirety of boundary B1, and along a portion of boundary B3 between boundary B4 and well region WR2.

Cell 400B includes well region WR1 extending from boundary B1 to boundary B3 along an entirety of boundary B4 and along a first portion of boundary B2 between boundary B1 and well region WR2 and a second portion of boundary B2 between well region WR2 and boundary B3. Well region WR1 extends from boundary B4 to boundary B2 along an entirety of boundary B1 and along an entirety of boundary B3.

Cell 400C includes well region WR1 extending from boundary B1 to boundary B3 along an entirety of boundary B4 and along a portion of boundary B2 between a first portion of well region WR2 and a second portion of well region WR2. Well region WR1 extends from boundary B4 to boundary B2 along a portion of boundary B1 between boundary B4 and the first portion of well region WR2, and along a portion of boundary B3 between boundary B4 and the second portion of well region WR2.

In the embodiments depicted in FIG. 4, well region WR1 designates a portion of a cell 400A-400C extending along boundary B4, and well region WR2 designates one or two additional portions of the cell 400A-400C as shaded regions. In some embodiments, well region WR2 corresponds to a portion of a cell 400A-400C extending along boundary B4, and well region WR1 corresponds to the one or two additional portions of the cell 400A-400C indicated by shaded regions, well regions WR1 and WR2 thereby being considered to be inverted.

Various embodiments of cells 400A-400C are capable of being combined, thereby defining portions of n-well and/or p-well structures shared among more than two rows of IC devices, as discussed below and further discussed with respect to FIGS. 5-7.

In the embodiment depicted in FIG. 4, cell height CH1 is a single cell height corresponding to the height of a row of IC devices including a single instance of a PMOS transistor aligned in the Y direction with a single instance of an NMOS transistor, and cell height CH2 is a double cell height equal to twice cell height CH1 and corresponding to two rows of IC devices. In some embodiments, cells 400A-400C have cell heights other than those depicted in FIG. 4, e.g., one or both of cells 400B or 400C has cell height CH1.

In each of the embodiments depicted in FIG. 4, cells 400A-400C includes each of well regions WR1 and WR2 having borders defined by boundaries extending in the X or Y directions. In some embodiments, one or more of cells 400A-400C includes well regions WR1 and WR2 having borders defined by one or more boundaries otherwise oriented, e.g., by extending diagonally with respect to the X and Y directions. In some embodiments, a cell 400A-400C does not include well region WR2 such that the boundaries of well region WR1 match cell boundaries B1-B4.

By the configurations discussed above, each of the IC layout diagrams corresponding to cells 400A-400C includes well region WR1 extending from boundaries B1 and B4 to respective boundaries B3 and B2 and is thereby capable of defining portions of well structures shared among more than two rows of IC devices as further discussed below with respect to FIGS. 5-7, thereby obtaining the benefits discussed above with respect to IC structure 100.

FIG. 5 is a flowchart of a method 500 of generating an IC layout diagram, e.g., an IC layout diagram of a cell 400A-400C discussed above with respect to FIG. 4, in accordance with some embodiments.

In some embodiments, generating the IC layout diagram includes generating the IC layout diagram corresponding to an IC structure, e.g., IC structure 100 discussed above with respect to FIGS. 1A-1C, manufactured based on the generated IC layout diagram.

In some embodiments, some or all of method 500 is executed by a processor of a computer, e.g., a processor 802 of an IC layout diagram generation system 800, discussed below with respect to FIG. 8.

Some or all of the operations of method 500 are capable of being performed as part of a design procedure performed in a design house, e.g., a design house 920 discussed below with respect to FIG. 9.

In some embodiments, the operations of method 500 are performed in the order depicted in FIG. 5. In some embodiments, the operations of method 500 are performed simultaneously and/or in an order other than the order depicted in FIG. 5. In some embodiments, one or more operations are performed before, between, during, and/or after performing one or more operations of method 500.

At operation 510, in some embodiments, an IC layout diagram of a stored cell is obtained from a storage device, the stored cell including one or both of the first and second well regions. In some embodiments, the stored cell includes each of the first well regions extending from a first cell boundary to a second cell boundary and free from extending from a third cell boundary to a fourth cell boundary.

In some embodiments, obtaining the IC layout diagram of the stored cell from the storage device includes obtaining the IC layout diagram of the stored cell from cell library 807 of IC layout diagram generation system 800, discussed below with respect to FIG. 8.

At operation 520, the first well region is extended from a first cell boundary to a second cell boundary, the first and second cell boundaries being opposite boundaries of the cell in a first direction. In some embodiments, the first direction is perpendicular to that of a cell height, e.g., the X direction perpendicular to cell height CH1 or CH2 discussed above with respect to FIG. 4.

In some embodiments, extending the first well region from the first cell boundary to the second cell boundary includes extending the first well region along an entirety of the third cell boundary and a portion of the fourth cell boundary. In some embodiments, extending the first well region from the first cell boundary to the second cell boundary includes extending the first well region along an entirety of the third cell boundary and an entirety of the fourth cell boundary. In some embodiments, extending the first well region from the first cell boundary to the second cell boundary includes extending the first well region along a portion of the third cell boundary and a portion of the fourth cell boundary.

In some embodiments, extending the first well region from the first cell boundary to the second cell boundary includes extending well region WR1 from boundary B4 to boundary B2 of a cell 400A-400C as discussed above with respect to FIG. 4.

At operation 530, the first well region is extended from a third cell boundary to a fourth cell boundary, the third and fourth cell boundaries being opposite boundaries of the cell in a second direction perpendicular to the first direction. In some embodiments, the second direction is that of a cell height, e.g., the Y direction of cell height CH1 or CH2 discussed above with respect to FIG. 4.

In some embodiments, extending the first well region from the third cell boundary to the fourth cell boundary includes extending the first well region along an entirety of the first cell boundary. In some embodiments, extending the first well region from the third cell boundary to the fourth cell boundary includes extending the first well region along a portion of the second cell boundary.

In some embodiments, extending the first well region from the third cell boundary to the fourth cell boundary includes extending well region WR1 from boundary B1 to boundary B3 of a cell 400A-400C as discussed above with respect to FIG. 4.

In some embodiments, extending the first well region from the third cell boundary to the fourth cell boundary includes increasing a size of the first well region of the stored cell obtained in operation 510 and decreasing a size of the second well region of the stored cell obtained in operation 510.

At operation 540, in some embodiments, each of the first and second well regions is overlapped with a pickup region. In some embodiments, overlapping each of the first and second well regions with the pickup region includes overlapping well region WR1 with pickup region PR1 and overlapping well region WR2 with pickup region PR2, as discussed above with respect to FIG. 4.

At operation 550, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram in cell library 807 or over network 814 of IC layout diagram generation system 800, discussed below with respect to FIG. 8.

At operation 560, in some embodiments, the IC layout diagram is placed in an IC layout diagram of an IC die. In various embodiments, placing the IC layout diagram in the IC layout diagram of the IC die includes rotating the IC layout diagram about one or more axes, shifting the IC layout diagram relative to one or more additional IC layout diagrams in one or more directions, and/or inverting the first and second well regions.

In some embodiments, placing the IC layout diagram in the IC layout diagram of the IC die includes placing the IC layout diagram in one of IC layout diagrams 600A-600C discussed below with respect to FIGS. 6A-6C.

In some embodiments, placing the IC layout diagram in the IC layout diagram of the IC die includes executing one or more operations of method 700 discussed below with respect to FIG. 7.

At operation 570, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 9.

At operation 580, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 9.

By executing some or all of the operations of method 500, an IC layout diagram is generated corresponding to an IC structure in which first and second wells are shared among more than two rows of IC devices, thereby obtaining the benefits discussed above with respect to IC structure 100.

Figure 6A:
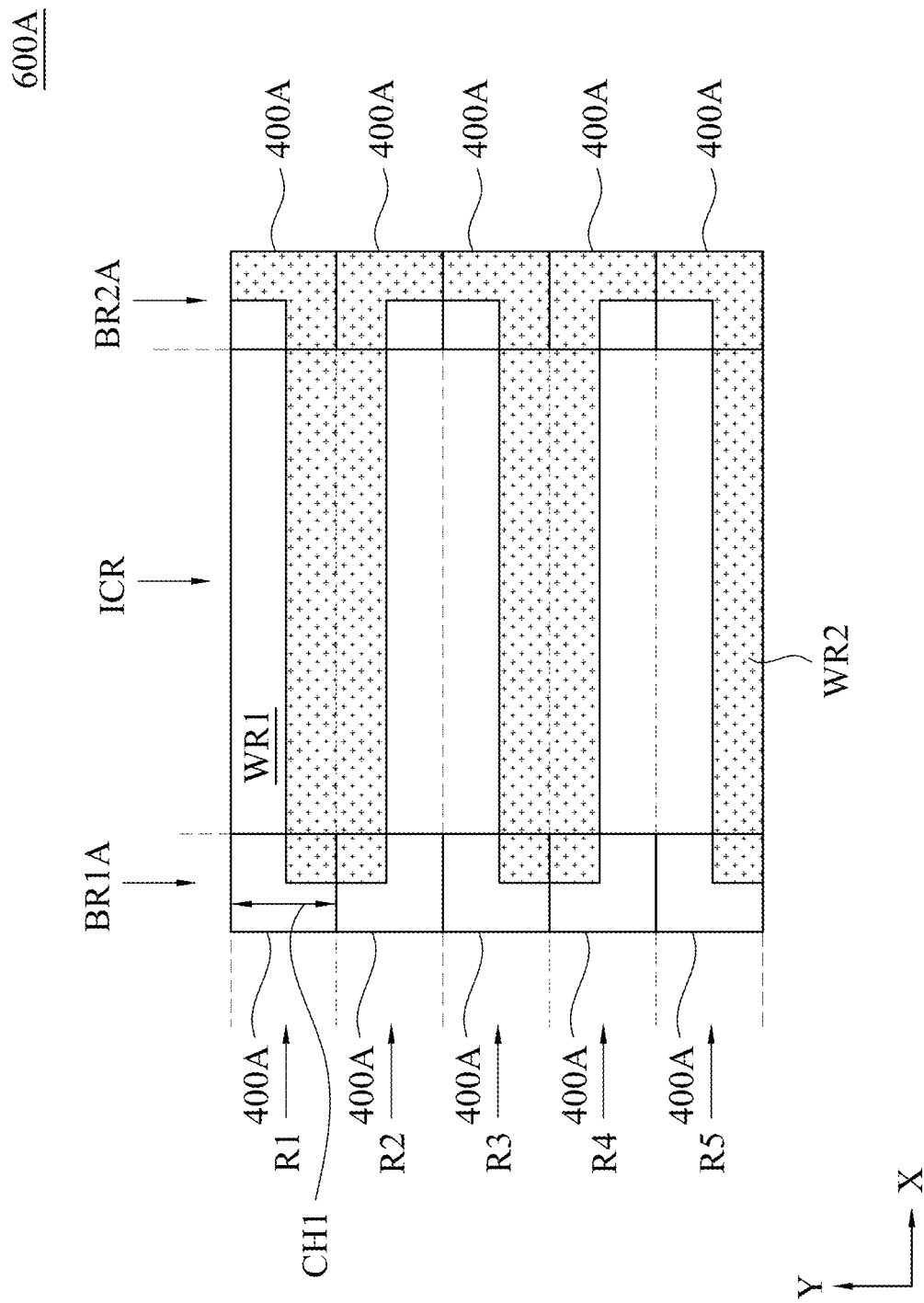
FIGS. 6A-6C are diagrams of IC layout diagrams, in accordance with some embodiments.
Figure 6B:
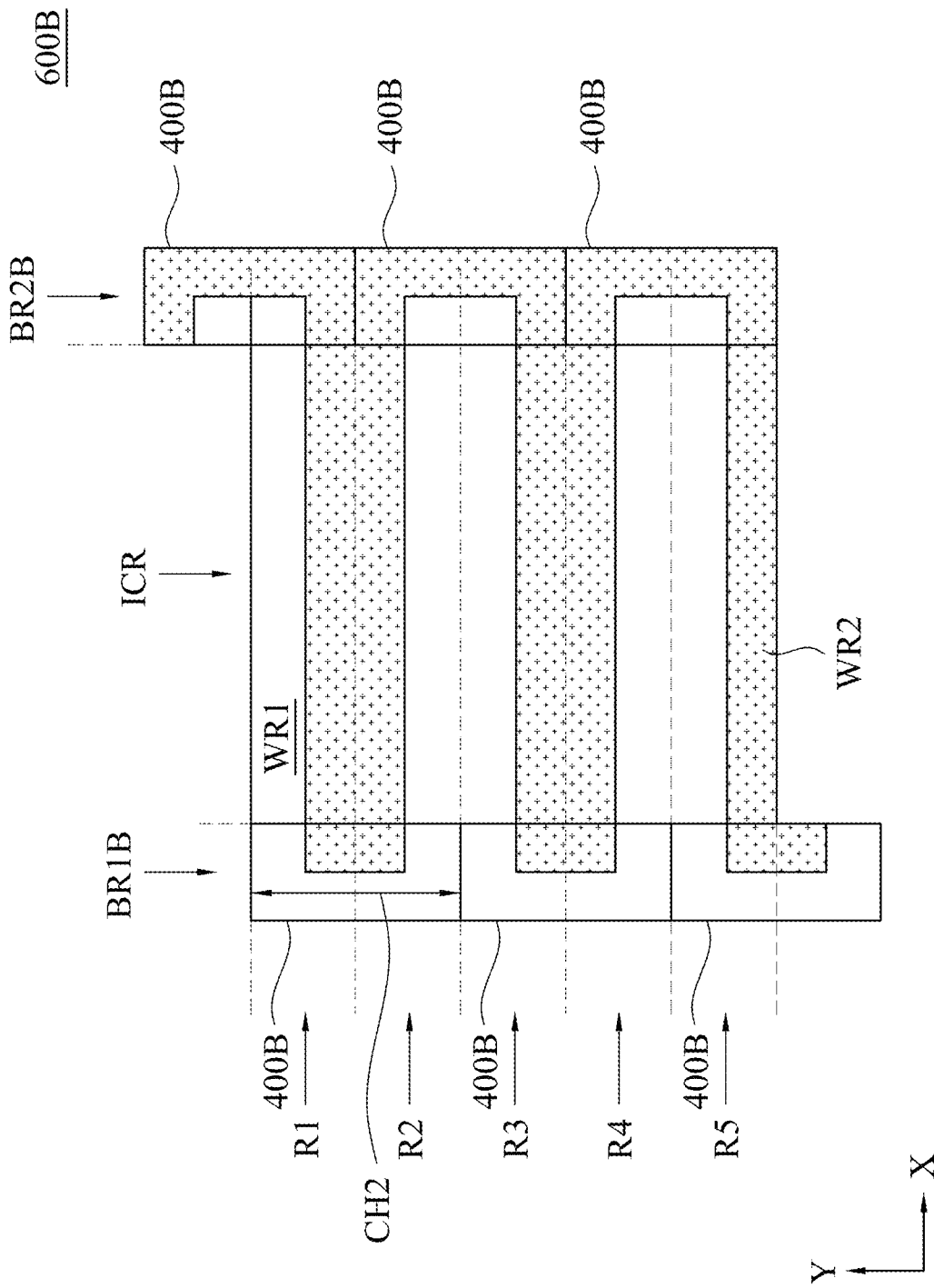
Figure 6C:
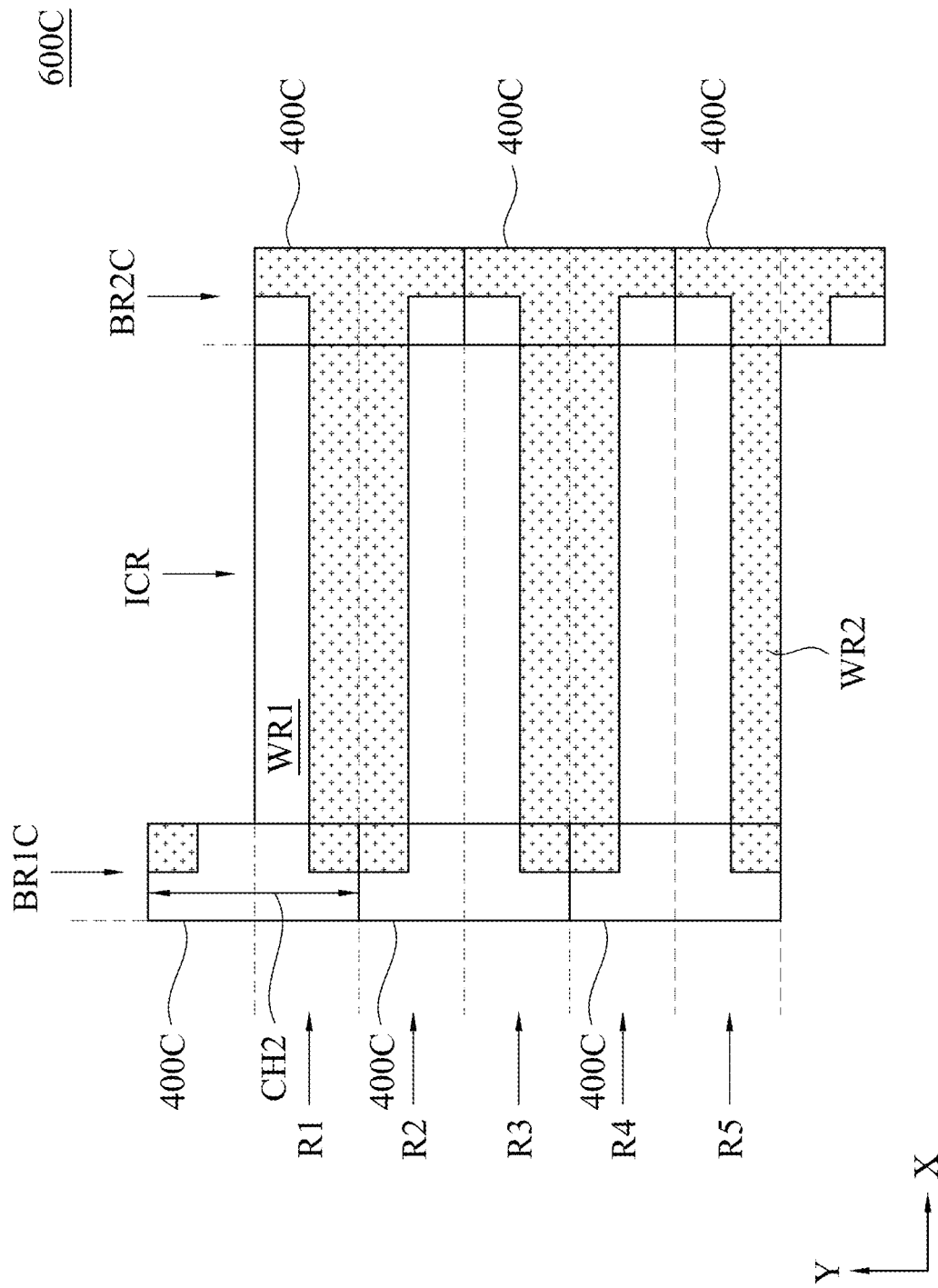

FIGS. 6A-6C are diagrams of respective IC layout diagrams 600A-600C, in accordance with some embodiments. FIGS. 6A-6C depict plan views of respective IC layout diagrams 600A-600C and the X and Y directions discussed above with respect to FIGS. 1A, 1B, and 4.

Each of IC layout diagrams 600A-600C includes an IC device region ICR including rows R1-R5 corresponding to rows R1-R5 of IC devices 100C, discussed above with respect to FIG. 1A. IC device region ICR is a region in each of IC layout diagrams 600A-600C including a plurality of cells and/or other IC layout features configured to be included in a manufacturing process as part of defining a plurality of IC devices, e.g., IC devices 100C. The depiction of IC device region ICR in each of FIGS. 6A-6C is simplified for the purpose of illustration, as discussed above with respect to FIG. 1A.

IC layout diagrams 600A-600C also include respective border regions BR1A-BR1C corresponding to border area 100A and respective border regions BR2A-BR2C corresponding to border area 100B, discussed above with respect to FIG. 1A. Each of border regions BR1A and BR2A includes multiple instances of cell 400A, each of border regions BR1B and BR2B includes multiple instances of cell 400B, and each of border regions BR1C and BR2C includes multiple instances of cell 400C, each discussed above with respect to FIG. 4.

The numbers of rows R1-R5 and instances of cells 400A-400C depicted in FIGS. 6A-6C are provided for the purpose of illustration. In various embodiments, one or more of IC layout diagrams 600A-600C includes one or more numbers of rows or cells other than the numbers depicted in FIGS. 6A-6C.

As discussed below, each of IC layout diagrams 600A-600C includes the corresponding instances of cells 400A-400C and IC device region ICR having an arrangement whereby well regions WR1 and WR2 extending in both the X and Y directions are defined. In some embodiments, well regions WR1 and WR2 correspond to respective continuous wells WA and WB discussed above with respect to FIG. 1A.

In the embodiment depicted in FIG. 6A, each of border regions BR1A and BR2A includes an instance of cell 400A in each of rows R1-R5. In border region BR1A, the instances of cell 400A in rows R1, R3, and R5 correspond to the embodiment depicted in FIG. 4, and the instances of cell 400A in rows R2 and R4 correspond to the embodiment depicted in FIG. 4 rotated about the x-axis. In border region BR2A, the instances of cell 400A in rows R2 and R4 correspond to the embodiment depicted in FIG. 4 rotated about the y-axis and including well regions WR1 and WR2 inverted, and the instances of cell 400A in rows R1, R3, and R5 correspond to the instances in rows R2 and R4 further rotated about the x-axis.

In the embodiment depicted in FIG. 6B, border area BR1B includes an instance of cell 400B in rows R1 and R2, an instance of cell 400B in rows R3 and R4, and an instance of cell 400B including a portion of row R5, each instance of cell 400B corresponding to the embodiment depicted in FIG. 4. Border area BR2B includes an instance of cell 400B including a portion of row R1, an instance of cell 400B in rows R2 and R3, and an instance of cell 400B in rows R4 and R5, each instance of cell 400B corresponding to the embodiment depicted in FIG. 4 rotated about the y-axis and including well regions WR1 and WR2 inverted.

In the embodiment depicted in FIG. 6C, border area BR1C includes an instance of cell 400C including a portion of row R1, an instance of cell 400C in rows R2 and R3, and an instance of cell 400C in rows R4 and R5, each instance of cell 400C corresponding to the embodiment depicted in FIG. 4. Border area BR2C includes an instance of cell 400C in rows R1 and R2, an instance of cell 400C in rows R3 and R4, and an instance of cell 400C including a portion of row R5, each instance of cell 400C corresponding to the embodiment depicted in FIG. 4 rotated about the y-axis and including well regions WR1 and WR2 inverted.

In the embodiments depicted in FIGS. 6A-6C, each of IC layout diagrams 600A-600C includes instances of a single one of cells 400A-400C positioned in each of corresponding border regions BR1A-BR1C and BR2A-BR2C, whereby corresponding well regions WR1 and WR2 of cells 400A-400C and IC device region ICR are aligned in the X direction. In various embodiments, one or more of IC layout diagrams 600A-600C includes instances of more than one of cells 400A-400C positioned in one or both of corresponding border regions BR1A-BR1C and BR2A-BR2C, whereby corresponding well regions WR1 and WR2 of cells 400A-400C and IC device region ICR are otherwise aligned in the X direction.

Each of IC layout diagrams 600A-600C includes one or more instances of a pickup region (not shown) in each of well regions WR1 and WR2 corresponding to one or more pickup structures in the well structures manufactured based on the IC layout diagram 600A-600C. Numbers of pickup regions are related to numbers of rows of IC device region ICR and numbers of portions of well regions WR1 and WR2 extending in the X direction in accordance with the discussion above with respect to pickup structures PA and PB of IC structure 100 and FIGS. 1A-3.

In some embodiments, the one or more pickup regions are included in IC device region ICR, e.g., as one or more tap cells, thereby corresponding to pickup structures PA and PB as depicted in FIG. 1A. In some embodiments, the one or more pickup regions are pickup regions PR1 and PR2 included in one or more instances of the cells 400A-400C included in the corresponding IC layout diagram 600A-600C.

By the configurations discussed above, each of IC layout diagrams 600A-600C includes each of well regions WR1 and WR2 configured to define portions of well structures shared among more than two rows of IC devices as further discussed below with respect to FIG. 7, thereby obtaining the benefits discussed above with respect to IC structure 100. In embodiments including one or more pickup regions PR1 and PR2, the area available for IC devices defined by IC device region ICR is further increased, thereby further improving layout efficiency and improving routing flexibility compared to approaches in which one or more pickup regions are positioned in an IC device region.

Figure 7:
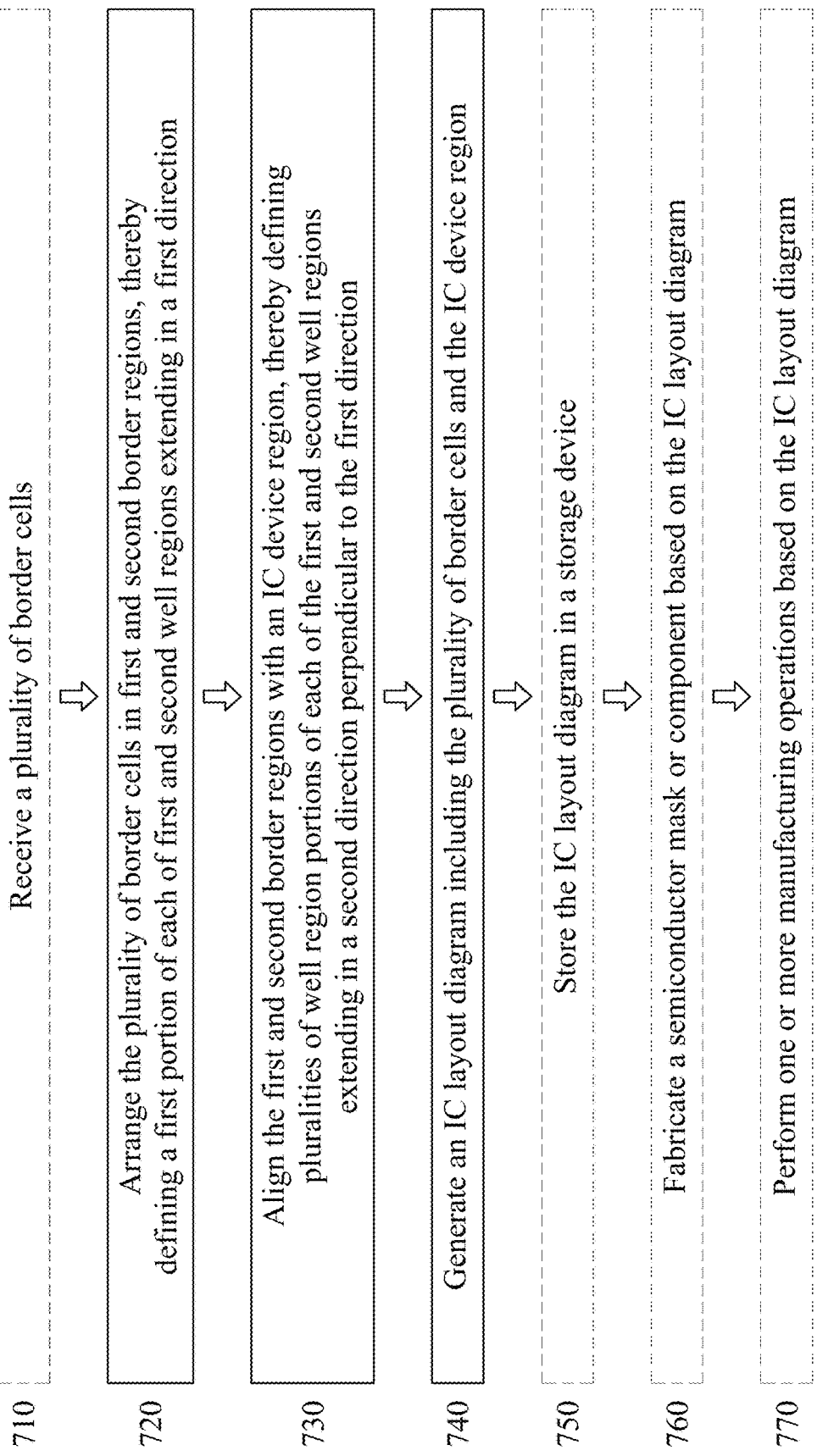
FIG. 7 is a flowchart of a method of generating an IC layout diagram, in accordance with some embodiments.

FIG. 7 is a flowchart of a method 700 of generating an IC layout diagram, e.g., one of IC layout diagrams 600A-600C discussed above with respect to FIGS. 6A-6C, in accordance with some embodiments. In some embodiments, generating the IC layout diagram includes generating the IC layout diagram corresponding to IC structure 100 discussed above with respect to FIGS. 1A-3 manufactured based on the generated IC layout diagram.

In some embodiments, some or all of method 700 is executed by a processor of a computer. In some embodiments, some or all of method 700 is executed by a processor 802 of IC layout diagram generation system 800 discussed below with respect to FIG. 8.

Some or all of the operations of method 700 are capable of being performed as part of a design procedure performed in a design house, e.g., design house 920 discussed below with respect to FIG. 9.

In some embodiments, the operations of method 700 are performed in the order depicted in FIG. 7. In some embodiments, the operations of method 700 are performed simultaneously and/or in an order other than the order depicted in FIG. 7. In some embodiments, one or more operations are performed before, between, during, and/or after performing one or more operations of method 700.

At operation 710, in some embodiments, a plurality of border cells is received. Receiving the plurality of border cells includes receiving each border cell of the plurality of border cells including a first well region extending from a first boundary to a second boundary and from a third boundary to a fourth boundary.

In various embodiments, receiving the plurality of border cells includes receiving some or all of the plurality of border cells having the same or varying orientations and/or including first and second well regions having the same or reversed designations.

In some embodiments, receiving the plurality of border cells includes receiving pluralities of one or more of cells 400A-400C discussed above with respect to FIG. 4. In some embodiments, receiving the plurality of border cells includes performing one or more operations of method 500 discussed above with respect to FIG. 5.

In some embodiments, receiving the plurality of border cells includes receiving the plurality of border cells from a cell library, e.g., cell library 807 discussed below with respect to FIG. 8.

At operation 720, the plurality of border cells is arranged in first and second border regions, thereby defining a first portion of each of first and second well regions extending in a first direction. In some embodiments, defining the first portion includes aligning the third and fourth boundaries of the pluralities in the first direction.

In some embodiments, arranging the plurality of border cells includes reorienting one or more of the border cells and/or inverting first and second well regions of one or more of the border cells as discussed above with respect to FIG. 4.

In some embodiments, arranging the plurality of border cells in the one or more border regions includes arranging two or more of cells 400A-400C in border regions BR1A-BR1C and BR2A-BR2C as discussed above with respect to FIGS. 6A-6C.

At operation 730, the first and second border regions are aligned with an IC device region, thereby defining pluralities of well region portions of each of the first and second well regions extending in a second direction perpendicular to the first direction.

Aligning the first and second border regions with the IC device design region includes aligning n-well and p-well regions of each of the border regions with n-well and p-well regions of the IC device design region.

In some embodiments, aligning the first and second border regions with the IC device region includes aligning two or more of cells 400A-400C in border regions BR1A-BR1C and BR2A-BR2C with IC device design region ICR as discussed above with respect to FIGS. 6A-6C.

At operation 740, an IC layout diagram including the plurality of border cells and the IC device design region is generated. Generating the IC layout diagram is performed by a processor, e.g., processor 802 of IC layout diagram generation system 800 discussed below with respect to FIG. 8. In some embodiments, generating the IC layout diagram including the plurality of border cells and the IC device design region includes executing one or more automated place-and-route (APR) algorithms, whereby one or more functional cells are positioned in the IC device region.

In some embodiments, generating the IC layout diagram includes generating one of IC layout diagrams 600A-600C discussed above with respect to FIGS. 6A-6C.

In some embodiments, the plurality of border cells is one plurality of border cells of multiple pluralities of border cells, the IC device design region is one IC device design region of a plurality of IC device design regions, and generating the IC layout diagram includes generating the IC layout diagram including the multiple pluralities of border cells and the plurality of IC device design regions.

In some embodiments, generating the IC layout diagram including the plurality of border cells and the IC device design region includes generating the IC layout diagram further including one or more TSV regions configured to be included in a manufacturing process as part of defining one or more TSV structures, e.g., TSV structure TSVS discussed above with respect to FIGS. 1B and 1C.

At operation 750, in some embodiments, the IC layout diagram is stored in a storage device. In various embodiments, storing the IC layout diagram in the storage device includes storing the IC layout diagram in a non-transitory, computer-readable memory or a cell library, e.g., a database, and/or includes storing the IC layout diagram over a network. In various embodiments, storing the IC layout diagram in the storage device includes storing the IC layout diagram in computer-readable storage medium 804 and/or over network 814 of IC layout diagram generation system 800, discussed below with respect to FIG. 8.

At operation 760, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to IC manufacturing system 900 and FIG. 9.

At operation 770, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 9.

By executing some or all of the operations of method 700, an IC layout diagram is generated corresponding to an IC structure in which first and second wells are shared among more than two rows of IC devices, thereby obtaining the benefits discussed above with respect to IC structure 100 and IC layout diagrams 600A-600C.

Figure 8:
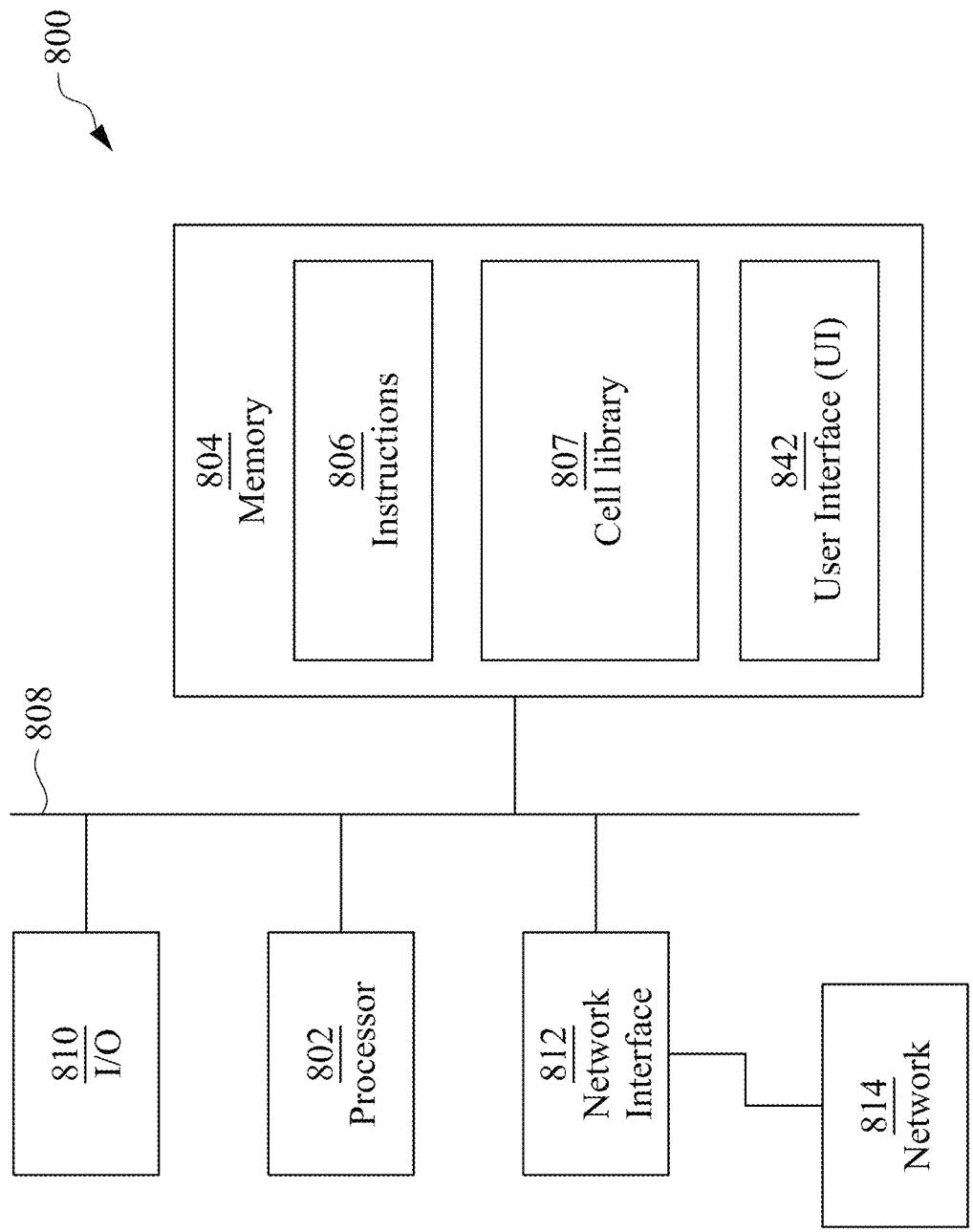
FIG. 8 is a block diagram of an IC layout diagram generation system, in accordance with some embodiments.

FIG. 8 is a block diagram of IC layout diagram generation system 800, in accordance with some embodiments. Methods described herein of designing IC layout diagrams in accordance with one or more embodiments are implementable, for example, using IC layout diagram generation system 800, in accordance with some embodiments.

In some embodiments, IC layout diagram generation system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of a method, e.g., method 500 of generating an IC layout diagram described above with respect to FIG. 5 and/or method 700 of generating an IC layout diagram described above with respect to FIG. 7 (hereinafter, the noted processes and/or methods).

Processor 802 is electrically coupled to computer-readable storage medium 804 via a bus 808. Processor 802 is also electrically coupled to an I/O interface 810 by bus 808. A network interface 812 is also electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause IC layout diagram generation system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, computer-readable storage medium 804 stores computer program code 806 configured to cause IC layout diagram generation system 800 (where such execution represents (at least in part) the EDA tool) to be usable for performing a portion or all of the noted processes and/or methods. In one or more embodiments, computer-readable storage medium 804 also stores information which facilitates performing a portion or all of the noted processes and/or methods. In one or more embodiments, computer-readable storage medium 804 stores cell library 807 of cells including such cells as disclosed herein, e.g., cells 400A-400C discussed above with respect to FIGS. 4-7.

IC layout diagram generation system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

IC layout diagram generation system 800 also includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 800.

IC layout diagram generation system 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. IC layout diagram generation system 800 is configured to receive information related to a UI through I/O interface 810. The information is stored in computer-readable medium 804 as user interface (UI) 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
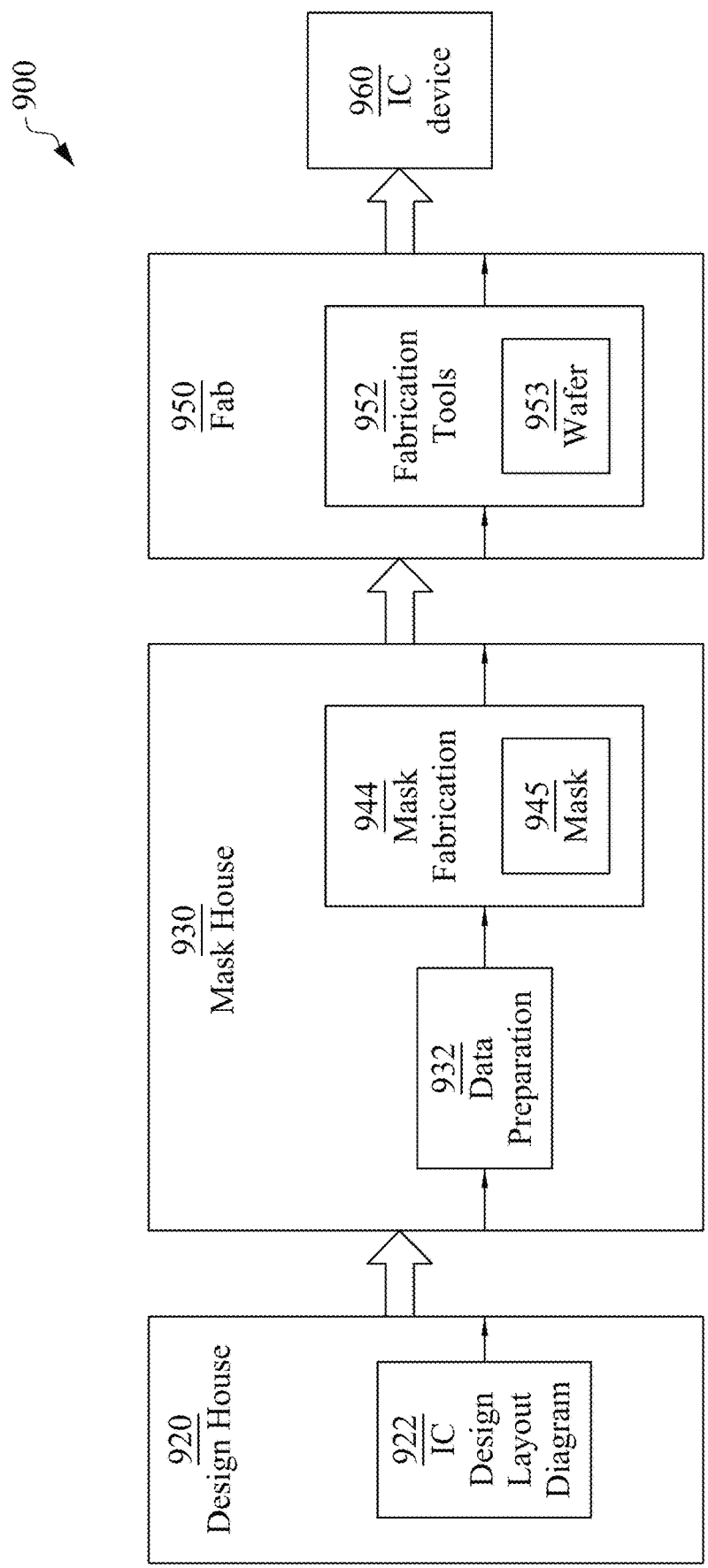
FIG. 9 is a block diagram of an IC manufacturing system, and an IC manufacturing flow associated therewith, in accordance with some embodiments.

FIG. 9 is a block diagram of IC manufacturing system 900, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout diagram 922. IC design layout diagram 922 includes various geometrical patterns, e.g., a cell 400A-400C and/or IC layout diagram 600A-600C discussed above with respect to FIGS. 4-7. The geometrical patterns correspond to patterns of metal, oxide, or semiconductor layers that make up the various components of IC device 960 to be fabricated. The various layers combine to form various IC features. For example, a portion of IC design layout diagram 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place and route. IC design layout diagram 922 is presented in one or more data files having information of the geometrical patterns. For example, IC design layout diagram 922 can be expressed in a GDSII file format or DFII file format.

Mask house 930 includes data preparation 932 and mask fabrication 944. Mask house 930 uses IC design layout diagram 922 to manufacture one or more masks 945 to be used for fabricating the various layers of IC device 960 according to IC design layout diagram 922. Mask house 930 performs mask data preparation 932, where IC design layout diagram 922 is translated into a representative data file (RDF). Mask data preparation 932 provides the RDF to mask fabrication 944. Mask fabrication 944 includes a mask writer. A mask writer converts the RDF to an image on a substrate, such as a mask (reticle) 945 or a semiconductor wafer 953. The design layout diagram 922 is manipulated by mask data preparation 932 to comply with particular characteristics of the mask writer and/or requirements of IC fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

It should be understood that the above description of mask data preparation 932 has been simplified for the purposes of clarity. In some embodiments, data preparation 932 includes additional features such as a logic operation (LOP) to modify the IC design layout diagram 922 according to manufacturing rules. Additionally, the processes applied to IC design layout diagram 922 during data preparation 932 may be executed in a variety of different orders.

After mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Mask 945 can be formed in various technologies. In some embodiments, mask 945 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 945 includes a transparent substrate (e.g., fused quartz) and an opaque material (e.g., chromium) coated in the opaque regions of the binary mask. In another example, mask 945 is formed using a phase shift technology. In a phase shift mask (PSM) version of mask 945, various features in the pattern formed on the phase shift mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

IC fab 950 is an IC fabrication business that includes one or more manufacturing facilities for the fabrication of a variety of different IC products. In some embodiments, IC Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 950 includes wafer fabrication tools 952 configured to execute various manufacturing operations on semiconductor wafer 953 such that IC device 960 is fabricated in accordance with the mask(s), e.g., mask 945. In various embodiments, fabrication tools 952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 950 uses mask(s) 945 fabricated by mask house 930 to fabricate IC device 960. Thus, IC fab 950 at least indirectly uses IC design layout diagram 922 to fabricate IC device 960. In some embodiments, semiconductor wafer 953 is fabricated by IC fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multi-level interconnects, and the like (formed at subsequent manufacturing steps).

Details regarding an IC manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an IC structure includes a first continuous well being one of an n-well or a p-well, the first continuous well including a first well portion extending in a first direction, a second well portion extending from the first well portion in a second direction perpendicular to the first direction, and a third well portion extending from the first well portion in the second direction parallel to the second well portion. In some embodiments, the IC structure includes a second continuous well being the other of the n-well or the p-well, the second continuous well including a fourth well portion extending in the first direction, a fifth well portion extending from the fourth well portion in a third direction opposite the second direction, and between the second and third well portions, and a sixth well portion extending from the fourth well portion in the third direction and parallel to the fifth well portion. In some embodiments, the second and fifth well portions correspond to a first row of IC devices, and the third and sixth well portions correspond to a second row of IC devices. In some embodiments, the IC structure includes a third continuous well including a seventh well portion extending in the first direction, an eighth well portion extending from the seventh well portion in the second direction, and a ninth well portion extending from the seventh well portion in the second direction parallel to the eighth well portion, and a TSV structure positioned between the third continuous well and the first and second continuous wells. In some embodiments, the first and second continuous wells, the TSV structure, and the third continuous well are aligned along the second direction. In some embodiments, each of the fourth and seventh well portions is positioned along of a border of an isolation structure of the TSV structure. In some embodiments, a first IC die includes the IC structure, an IC package includes the first IC die and a second IC die, and the TSV structure is electrically connected to the second IC die. In some embodiments, the first continuous well is the n-well and includes a single pickup structure electrically connected to a first power distribution structure configured to have a power supply voltage, and the second continuous well is the p-well and includes a single pickup structure electrically connected to a second power distribution structure configured to have a reference voltage.

In some embodiments, an IC structure includes first and second TSV isolation structures aligned along a first direction, a first continuous well being one of an n-well or a p-well, the first continuous well including a first well portion adjacent to the first TSV isolation structure, and a plurality of second well portions extending from the first well portion in the first direction, and a second continuous well being the other of the n-well or the p-well, the second continuous well including a third well portion adjacent to the second TSV isolation structure, and a plurality of fourth well portions extending from the third well portion in a second direction opposite the first direction, wherein the plurality of second well portions alternates with the plurality of fourth well portions along a third direction perpendicular to the first and second directions. In some embodiments, the IC structure includes a plurality of tap structures, wherein each tap structure of the plurality of tap structures includes a first pickup structure electrically connected to the first continuous well and a first power distribution structure and a second pickup structure electrically connected to the second continuous well and a second power distribution structure separate from the first power distribution structure, and a number of tap structures of the plurality of tap structures is less than a number of well portions of each of the plurality of second well portions and the plurality of fourth well portions. In some embodiments, a ratio of the number of well portions of each of the plurality of second well portions and the plurality of fourth well portions to the number of tap structures of the plurality of tap structures has a value ranging from five to fifteen. In some embodiments, a tap structure of the plurality of tap structures is located adjacent to one of the first or third well portions. In some embodiments, the first and second continuous wells are included in a first die of a 3DIC package, the first TSV isolation structure surrounds a first TSV structure electrically connected to a second die of the 3DIC package, and the second TSV isolation structure surrounds a second TSV structure electrically connected to the second die. In some embodiments, the IC structure includes a plurality of rows of IC devices, wherein each row of IC devices of the plurality of rows of IC devices includes a first transistor located in a second well portion of the plurality of second well portions and a second transistor located in a fourth well portion of the plurality of fourth well portions.

In some embodiments, a method of manufacturing an IC structure includes configuring each of an n-well and a p-well in a first IC die to have a first portion extending in a first direction and second and third portions extending from the first portion in a second direction perpendicular to the first direction, and forming IC devices including a first pickup structure electrically connected to the n-well and a second pickup structure electrically connected to the p-well. Forming the IC devices includes forming a PMOS transistor in the second or third portion of the n-well and forming an NMOS transistor in the second or third portion of the p-well. In some embodiments, configuring each of the n-well and the p-well to have the second and third portions extending from the first portion in the second direction includes the second and third portions of the n-well and p-well having an interdigitated configuration. In some embodiments, configuring the n-well includes performing an implantation process on a p-type substrate, and configuring the p-well includes configuring an area outside the n-well as the p-well based on being a portion of the p-type substrate. In some embodiments, forming the IC devices includes forming a first electrical connection from the first pickup structure to a first power distribution structure configured to have a power supply voltage and forming a second electrical connection from the second pickup structure to a second power distribution structure configured to have a reference voltage. In some embodiments, the method includes constructing a TSV structure in the first die adjacent to the first portion of the n-well or the first portion of the p-well. In some embodiments, the method includes electrically connecting the TSV structure to a second IC die of an IC package.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) structure comprising:
a first continuous well being one of an n-well or a p-well, the first continuous well comprising:
   a first well portion extending in a first direction;
   a second well portion extending from the first well portion in a second direction perpendicular to the first direction; and
   a third well portion extending from the first well portion in the second direction parallel to the second well portion.

2. The IC structure of claim 1, further comprising:
a second continuous well being the other of the n-well or the p-well, the second continuous well comprising:
   a fourth well portion extending in the first direction;
   a fifth well portion extending from the fourth well portion in a third direction opposite the second direction, and between the second and third well portions; and
   a sixth well portion extending from the fourth well portion in the third direction and parallel to the fifth well portion.

3. The IC structure of claim 2, wherein
the second and fifth well portions correspond to a first row of IC devices, and
the third and sixth well portions correspond to a second row of IC devices.

4. The IC structure of claim 2, further comprising:
a third continuous well comprising:
   a seventh well portion extending in the first direction;
   an eighth well portion extending from the seventh well portion in the second direction; and
   a ninth well portion extending from the seventh well portion in the second direction parallel to the eighth well portion; and
a through-silicon-via (TSV) structure positioned between the third continuous well and the first and second continuous wells.

5. The IC structure of claim 4, wherein the first and second continuous wells, the TSV structure, and the third continuous well are aligned along the second direction.

6. The IC structure of claim 5, wherein each of the fourth and seventh well portions is positioned along of a border of an isolation structure of the TSV structure.

7. The IC structure of claim 4, wherein
a first IC die comprises the IC structure,
an IC package comprises the first IC die and a second IC die, and
the TSV structure is electrically connected to the second IC die.

8. The IC structure of claim 2, wherein
the first continuous well is the n-well and comprises a first single pickup structure electrically connected to a first power distribution structure configured to have a power supply voltage, and
the second continuous well is the p-well and comprises a second single pickup structure electrically connected to a second power distribution structure configured to have a reference voltage.

9. An integrated circuit (IC) structure comprising:
first and second through-silicon-via (TSV) isolation structures aligned along a first direction;
a first continuous well being one of an n-well or a p-well, the first continuous well comprising:
   a first well portion adjacent to the first TSV isolation structure; and
   a plurality of second well portions extending from the first well portion in the first direction; and a second continuous well being the other of the n-well or the p-well, the second continuous well comprising:
a third well portion adjacent to the second TSV isolation structure; and
a plurality of fourth well portions extending from the third well portion in a second direction opposite the first direction,
wherein the plurality of second well portions alternates with the plurality of fourth well portions along a third direction perpendicular to the first and second directions.

10. The IC structure of claim 9, further comprising a plurality of tap structures, wherein
each tap structure of the plurality of tap structures comprises:
a first pickup structure electrically connected to the first continuous well and a first power distribution structure; and
a second pickup structure electrically connected to the second continuous well and a second power distribution structure separate from the first power distribution structure, and
a number of tap structures of the plurality of tap structures is less than a number of well portions of each of the plurality of second well portions and the plurality of fourth well portions.

11. The IC structure of claim 10, wherein a ratio of the number of well portions of each of the plurality of second well portions and the plurality of fourth well portions to the number of tap structures of the plurality of tap structures has a value ranging from five to fifteen.

12. The IC structure of claim 10, wherein a tap structure of the plurality of tap structures is located adjacent to one of the first or third well portions.

13. The IC structure of claim 9, wherein
the first and second continuous wells are included in a first die of a 3DIC package,
the first TSV isolation structure surrounds a first TSV structure electrically connected to a second die of the 3DIC package, and
the second TSV isolation structure surrounds a second TSV structure electrically connected to the second die.

14. The IC structure of claim 9, further comprising a plurality of rows of IC devices, wherein each row of IC devices of the plurality of rows of IC devices comprises:

a first transistor located in a second well portion of the plurality of second well portions; and
a second transistor located in a fourth well portion of the plurality of fourth well portions.

15. An integrated circuit (IC) structure comprising:
a first continuous well comprising:
a first well portion extending in a first direction;
a second well portion extending from the first well portion in a second direction perpendicular to the first direction; and
a third well portion extending from the first well portion in the second direction parallel to the second well portion;
a second continuous well comprising:
a fourth well portion extending in the first direction;
a fifth well portion extending from the fourth well portion in a third direction opposite the second direction; and
a sixth well portion extending from the fourth well portion in the third direction parallel to the fifth well portion; and
a through-silicon-via (TSV) structure positioned between the first and fourth well portions.

16. The IC structure of claim 15, wherein
the first continuous well is one of an n-well or a p-well, and
the second continuous well the other of the n-well or p-well.

17. The IC structure of claim 15, further comprising a TSV isolation structure positioned between the first and fourth well portions and surrounding the TSV structure.

18. The IC structure of claim 15, wherein
a single one of the first through third well portions comprises a first tap structure, and
a single one of the fourth through sixth well portions comprises a second tap structure.

19. The IC structure of claim 15, wherein each of the second, third, fifth, and sixth well portions corresponds to a row of IC devices.

20. The IC structure of claim 15, wherein
the TSV structure is a first TSV structure,
the IC structure further comprises a second TSV structure, and
the second continuous well is positioned between the first and second TSV structures.

* * * * *